(12) United States Patent
Kannan et al.

(10) Patent No.: US 8,574,448 B2
(45) Date of Patent: Nov. 5, 2013

(54) PLASMA GENERATION METHOD, CLEANING METHOD, AND SUBSTRATE PROCESSING METHOD

(75) Inventors: Hiroshi Kannan, Tokyo (JP); Noboru Tamura, Nakakoma-Gun (JP); Kazuya Dobashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 12/752,813

(22) Filed: Apr. 1, 2010

(65) Prior Publication Data

US 2010/0252068 A1 Oct. 7, 2010

Related U.S. Application Data

(63) Continuation of application No. 10/562,400, filed as application No. PCT/JP2004/009026 on Jun. 25, 2004, now abandoned.

(30) Foreign Application Priority Data

Jun. 27, 2003 (JP) .................................. 2003-185160
Jun. 27, 2003 (JP) .................................. 2003-185161

(51) Int. Cl.
*B44C 1/22* (2006.01)
*C03C 15/00* (2006.01)
*C03C 25/68* (2006.01)
*C23F 3/00* (2006.01)

(52) U.S. Cl.
USPC ............................. 216/67; 134/1.1; 204/164

(58) Field of Classification Search
USPC .................... 216/67, 68; 134/1.1; 204/164
See application file for complete search history.

(56) References Cited

U.S. PATENT DOCUMENTS

| 4,431,898 A | 2/1984 | Reinberg et al. |
| 4,662,977 A | 5/1987 | Motley et al. |
| 5,288,971 A * | 2/1994 | Knipp ..................... 219/121.57 |
| 5,413,670 A | 5/1995 | Langan et al. |
| 5,460,689 A | 10/1995 | Raaijmakers et al. |
| 5,782,085 A * | 7/1998 | Steinwandel et al. .......... 60/274 |
| 5,916,455 A | 6/1999 | Kumagai |
| 6,374,831 B1 | 4/2002 | Chandran et al. |
| 2001/0048981 A1 | 12/2001 | Suzuki |

(Continued)

FOREIGN PATENT DOCUMENTS

| JP | 58-45736 A | 3/1983 |
| JP | 03-170678 A | 7/1991 |

(Continued)

OTHER PUBLICATIONS

International Search Report dated Oct. 12, 2004, 4 pages.

(Continued)

*Primary Examiner* — Nadine Norton
*Assistant Examiner* — Mahmoud Dahimene
(74) *Attorney, Agent, or Firm* — Crowell & Moring LLP

(57) ABSTRACT

A plasma generation method in a toroidal plasma generator that includes a gas passage having a gas entrance and a gas outlet and forming a circuitous path and a coil wound around a part of the gas passage includes the steps of supplying a mixed gas of an Ar gas and an $NF_3$ gas containing at least 5% of $NF_3$ and igniting plasma by driving the coil with a high-frequency power, wherein the plasma ignition step is conducted under a total pressure of 6.65-66.5 Pa.

20 Claims, 16 Drawing Sheets

(56) References Cited

U.S. PATENT DOCUMENTS

| | | | |
|---|---|---|---|
| 2002/0000198 A1* | 1/2002 | Ishikawa et al. | 118/715 |
| 2002/0020429 A1* | 2/2002 | Selbrede et al. | 134/1.1 |
| 2003/0071035 A1* | 4/2003 | Brailove | 219/672 |
| 2003/0129106 A1 | 7/2003 | Sorensen et al. | |

FOREIGN PATENT DOCUMENTS

| | | |
|---|---|---|
| JP | 07-153739 A | 6/1995 |
| JP | 07-283140 A | 10/1995 |
| JP | 08-288223 A | 11/1996 |
| JP | 09-251935 A | 9/1997 |
| JP | 11-319545 A | 11/1999 |
| JP | 2001-020076 | 1/2001 |
| JP | 2001-020078 | 1/2001 |
| JP | 2001-085418 A | 3/2001 |
| JP | 2002-075973 A | 3/2002 |
| JP | 2002-343600 A | 11/2002 |
| JP | 2003-151971 A | 5/2003 |
| KR | 1999-0063077 A | 7/1999 |
| KR | 2003-0002465 A | 1/2003 |
| KR | 2003-0042494 A | 6/2003 |

OTHER PUBLICATIONS

Japanese Office Action mailed Apr. 21, 2009.
English Translation of Japanese Office Action mailed Apr. 14, 2009.
Korean Office Action dated May 16, 2008, 2 pages.
English Translation of Japanese Office Action mailed Jan. 5, 2010.

\* cited by examiner

US 8,574,448 B2

PLASMA GENERATION METHOD, CLEANING METHOD, AND SUBSTRATE PROCESSING METHOD

This application is a continuation of U.S. application Ser. No. 10/562,400 filed on Dec. 27, 2005, which is the U.S. national stage of International Patent Application No. PCT/JP2004/009026 filed on Jun. 25, 2004, the entire contents of which is incorporated by reference herein. Priority is claimed based on Japanese Patent Application No. 2003-185160 filed on Jun. 27, 2003, the entire contents of which is incorporated by reference herein, and Japanese Patent Application No. 2003-185161 filed on Jun. 27, 2003, the entire contents of which is incorporated by reference herein.

TECHNICAL FIELD

The present invention generally relates to fabrication of semiconductor devices and more particularly to a cleaning method and substrate processing method that uses plasma. Further, the present invention related to a plasma generator and particularly to a plasma ignition method.

Plasma generator is used extensively in fabrication of semiconductor devices or liquid crystal display devices. For example, with the use of plasma generator, it becomes possible to carry out film formation processing or etching processing at a low temperature in which there is caused no change of concentration profile of impurity elements formed in a semiconductor substrate. Further, plasma generator is used also for cleaning the interior of processing vessel after conducting a substrate processing therein.

BACKGROUND ART

FIG. 1 shows the construction of a typical conventional single-wafer CVD apparatus 10.

Referring to FIG. 1, the single-wafer CVD apparatus 10 includes a processing vessel 11 evacuated by a vacuum pump 13 via a shutdown valve 13A and a conductance valve 13B, wherein the processing vessel 11 includes therein a susceptor 12 having a heating mechanism (not shown) and holding thereon a substrate 12A to be processed. Thereby, the processing vessel 11 is provided with a showerhead 14 supplied with a source gas from a source gas supplying system 15 via a line L1 and a valve V1 such that the showerhead 14 faces the substrate 12A to be processed on the susceptor 12.

The source supplying system 15 includes source gas sources 15A-15C wherein the source gas in the source gas source 15A is supplied to the line L1 via a valve 15A while the source gas in the source gas source 15B is supplied to the line L1 via a valve 15VB. Further, the source gas in the source gas source 15C is supplied to the line L1 via a valve 15VC.

The source gas supplied via the line L1 is released to a processing space inside the processing vessel 11 via the showerhead 14, and desired film formation occurs at the surface of the substrate 12 to be processed as a result of the decomposition reaction taking place at the surface of the substrate 12A to be processed.

With the single-wafer CVD apparatus 10 of FIG. 1, there is provided a gate valve structure not illustrated on the processing vessel 11 for allowing loading and unloading of the substrate 12A to be processed, while the gate valve structure is coupled to a substrate transportation chamber. The single-wafer CVD apparatus 10 constructs a single-wafer substrate processing system together with other processing apparatuses coupled to the substrate transportation chamber.

With the single-wafer CVD apparatus 10 constituting such a single-wafer processing system, the substrate temperature is controlled during the film forming processing by a heating device formed in the susceptor 12 while the wall surface of the processing vessel 10 is maintained at a relatively low temperature from room temperature to 150° C. (cold wall).

With such a cold wall type CVD apparatus, it is inevitable that there is caused some deposition of reactants on the inner wall surface of the processing vessel 11 at the time of film deposition on the substrate 12A to be processed, and thus, it has been practiced to conduct a cleaning process for removing the deposits by causing to flow a cleaning gas acting an etchant to the interior of the processing vessel 11 each time film formation processing for one or plural substrates has been completed.

Particularly, with the CVD apparatuses used for fabrication of ultra-miniaturized semiconductor devices of these days, it is preferable to conduct the cleaning process as frequently as possible, ideally each time a substrate is processed, for recovering the predetermined initial processing condition. However, when such frequent cleaning processing has been conducted, the cleaning time associated with the cleaning processing causes serious decrease in the throughput of semiconductor production.

Thus, with the CVD apparatus of FIG. 1, there is provided a cleaning module outside the processing vessel 11 such that the cleaning module includes an etching gas source 16A, a plasma gas source 16B and a remote plasma source 16C, and a highly reactive etching gas formed by the remote plasma source 16C is introduced into the processing space inside the processing vessel 11 via the line L2 and the valve 16Vc. By providing the plasma source at the outside of the processing vessel 11, damaging of the inner wall of the processing vessel 11 by high energy plasma is avoided, and it becomes possible to conduct stable cleaning process. Further, with such a construction, the ions formed in the plasma cause recombination with electrons as they are transported from the remote plasma source 16C to the processing vessel 11, and thus, only the radicals that promote the reaction are supplied to the processing vessel 11 with the construction of FIG. 1.

In FIG. 1, it should be noted that the etching gas source 16A supplies an etching gas containing fluorine such as $NF_3$ to the remote plasma source 16C via a valve 16VA, while the plasma gas source 16B supplied a rare gas such as Ar to the remote plasma source 16C via a valve 16VB.

For the cleaning gas containing fluorine, it is also possible to use a non-halogen compound such as $CH_3COOH$, in addition to the halogen compound such as $NF_3$. Further, it is possible to use He, Ne, Kr, Xe, or the like, for the diluting gas from the plasma gas source 16B in place of Ar. Further, the diluting gas is not limited to a rare gas and it is also possible to use the gases such as $H_2O$, $O_2$, $H_2$, $N_2$, $C_2F_6$, or the like, for the diluting gas.

With regard to such a remote plasma source 16C, it is possible to use any of an induction coupled type plasma (ICP) generator 20 shown in FIG. 2A, an electron cyclotron resonance (ECR) type plasma generator shown in FIG. 2B, a helicon wave-excited plasma generator 40 shown in FIG. 2C, a microwave cavity type plasma generator shown in FIG. 2D, a toroidal type plasma generator 60 shown in FIG. 2E, and the like. Further, a capacitive-coupling plasma (CCP) generator 70 shown in FIG. 3 is used as the plasma source that is provided inside the processing vessel 11.

With the ICP type plasma generator 20 of FIG. 2A, a high-frequency coil 22 is wound around a plasma vessel 21, in which the plasma is generated, and plasma is formed inside the plasma vessel by driving the high-frequency coil 22 by a high-frequency power source 23.

With the ECR plasma generator 30 of FIG. 2B, magnets 32 are disposed around the plasma vessel 31 such that a magnetic field is applied to the space inside the plasma vessel 31, and electron cyclotron resonance is induced in the gas inside the vessel 31 by supplying a microwave power to the gas inside the processing vessel 31 from a microwave source 33.

With the helicon-wave type plasma generator 40 of FIG. 2C, a magnet 44 is provided close to the processing vessel 41 in which generation of plasma is to be achieved, and a loop antenna 42 is provided in the vicinity of the plasma vessel 41. By driving the loop antenna by a high-frequency power from a high-frequency power source 43, a helicon wave is propagated through the plasma vessel 41 and it becomes possible to realize a high-density plasma.

With the microwave cavity type plasma generator 50 of FIG. 2D, the plasma vessel 51, in which the plasma is formed, constitutes a microwave cavity, and plasma is formed by driving the microwave cavity by a microwave electric field from a microwave source 52.

With the toroidal plasma generator 60 of FIG. 2E, there is provided a cyclic gas passage 61 having a gas entrance 61A and a gas outlet 61B, and high-frequency coil is wound outside the gas passage 61.

Thus, a rare gas such as Ar introduced into the gas passage 61A circles around the cyclic gas passage 61, wherein plasma is induced in the rare gas by driving the high-frequency coil 62 by a microwave.

With the CCP-type plasma generator 70 of FIG. 3, there are disposed a pair of parallel plate electrodes 71A and 71B inside a plasma vessel 71 in which plasma is formed, and plasma is formed between the foregoing electrodes by driving the electrodes 71A and 71B by a high-frequency power source 72. Thus, the plasma generator 70 of FIG. 3 itself constitutes the plasma generator and the plasma vessel 71 is used for the processing vessel. In this case, the lower electrode 71B is used for the susceptor and the substrate to be processed is placed on the lower electrode 71B.

Particularly, with the toroidal plasma generator of FIG. 2E, there are obtained various advantageous features such as plasma generation taking place at a location offset from the wall surface of the generator, and introduction of charged particles of large mass such as ions into the processing space inside the processing vessel 11 being suppressed. Thus, it is thought preferable to use such a toroidal plasma generator in the plasma processing apparatus 10 of FIG. 1 as the remote plasma source 16C.

FIG. 4 shows the toroidal plasma generator 60 shown in FIG. 2E for used as the remote plasma source 16C in detail.

Referring to FIG. 4, the plasma generator 60 includes the cyclic gas passage 61 having the gas entrance 61A and the gas outlet 61B and the high-frequency coil 62 is wound around at the outside of the gas passage.

Thus, the rare gas such as Ar introduced into the gas entrance 61A circles around the circular gas passage 61, and plasma is induced in the foregoing rare gas by driving the high-frequency coil 62 by a high-frequency power. Thereby, there is formed a cyclic current path shown in FIG. 4 by a continuous line 61a in the gas passage 61 as the plasma thus induced circles around the gas passage 61 at high speed, and the line of magnetic force formed by the high-frequency coil is pinched down to a path coincident to the current path 61a as shown in FIG. 4 by a broken line 61b. With such pinching down of the line of magnetic force to the path 61b, there occurs corresponding pinching down of the electrons and ions in the plasma to the current path 61a, which is coincident to the path 61b of the line of magnetic force, resulting in further increase of the current density in the current path 61a. Such increase of the current density invites further pinching of the line of magnetic down to the path 61b for the line of magnetic force.

Thus, with the toroidal plasma generator 60 of FIG. 4, the high-density plasma is formed at the location offset from the wall surface that defines the cyclic gas passage 61, and because of this, there occurs little sputtering in the wall surface by the electrons accelerated to high energy state. Thereby, plasma formation occurs with little contamination, and the plasma thus formed with little contamination is maintained stably.

PATENT REFERENCE 1 U.S. Pat. No. 6,374,831.

DISCLOSURE OF THE INVENTION

Problems to be Solved by the Invention

Thus, with the toroidal plasma generator 60 of FIG. 4 it is possible to maintain high density plasma stably once it is formed, while there exists a problem with regard to plasma ignition as will be understood from the foregoing explanation. This problem appears particularly conspicuous when the plasma generator 60 of FIG. 4 is used for the remote plasma source 16 in the CVD apparatus 10 of FIG. 1.

Referring to FIG. 1 again, it can be seen that the $NF_3$ etching gas is supplied to the remote plasma source 16C with the CVD apparatus 10, wherein the compound containing fluorine and used for etching, such as $NF_3$, $F_2$, $CF_4$, $C_2F_6$, $C_3F_8$, $SF_6$, $ClF_3$, or the like, has a very large ionization energy as compared with Ar, and because of this, there arises a problem of difficulty of plasma ignition in the remote plasma source 16C when an etching gas containing fluorine having large electronegativity, such as $NF_3$, is added to the Ar gas from the Ar gas source 16B in the remote plasma source 16C.

FIG. 5 shows the relationship between the cleaning rate and the $NF_3$ gas concentration for the case of conducting a cleaning processing in the CVD apparatus 10 of FIG. 1 by using the toroidal type device 60 for the remote plasma source 16C, wherein it should be noted that the relationship of FIG. 5 was discovered by the inventor of the present invention in the investigation constituting the foundation of the present invention by changing the proportion of the $NF_3$ gas in the $Ar/NF_3$ mixed gas supplied to the remote plasma source 16C. In the experiment of FIG. 5, it should be noted that etching (cleaning) of a thermal oxide film formed on the substrate 12A of FIG. 1 was conducted by setting the pressure in the cyclic gas passage 61 of FIG. 4 to 1333 Pa (10 Torr), the temperature of the susceptor 12 to 100° C., and the total flow rate of the Ar gas and the $NF_3$ gas to 1500 SCCM. In the drawing, the cleaning rate in the vertical axis represents the film thickness change rate of the thermal oxide film per minute. The remote plasma source 16C was driven by a high-frequency power of 400 kHz frequency.

Referring to FIG. 5, it can be seen that the cleaning rate increases with increase in the $NF_3$ gas concentration in the $Ar/NF_3$ mixed gas. From this, it is derived that it is preferable to add $NF_3$ to the $Ar/NF_3$ mixed gas supplied to the remote plasma source 16C with the concentration ($=Ar/(Ar+NF_3)$) of at least 5%, in order to achieve the cleaning rate of 500 nm/minute or more under the pressure of 1200 Pa.

FIG. 6 shows the relationship between the cleaning rate and the $NF_3$ gas partial pressure in the CVD apparatus 10 of FIG. 1, wherein it should be noted that the experiment of FIG. 6, too, was made by the inventor of the present invention in the investigation that constitutes the foundation of the present invention while using the toroidal plasma generator 60 of FIG. 4 for the remote plasma source 16C. In the experiment of FIG. 6, it should be noted that the etching of the foregoing thermal oxide film was conducted under the condition of setting the concentration of the $NF_3$ gas supplied to the remote plasma source 16c to 45% and the total flow rate of the $Ar/NF_3$ mixed gas to 1500 SCCM, while changing the total pressure inside the processing vessel 11 variously.

Referring to FIG. 6, it can be seen that there occurs an increase of etching rate and hence cleaning rate by increasing the total pressure inside the processing vessel 11 (and thus the $NF_3$ gas partial pressure) when the concentration of the $NF_3$ gas is fixed. From the relationship of FIG. 6, it can be seen that a cleaning rate (etching rate) exceeding 500 nm per minute is realized at the pressure of about 266 Pa (2 Torr) or more, provided that the $NF_3$ concentration is set to 45%.

The results of FIGS. 5 and 6 indicates that a cleaning rate exceeding 500 nm per minute can be realized, in the case the toroidal plasma generator 60 shown in FIG. 4 is used as the remote plasma source 16C in the CVD apparatus 10 of FIG. 1, by increasing the $NF_3$ gas concentration in the $Ar/NF_3$ mixed gas or partial pressure supplied to the remote plasma source 16C, and thus, it is preferable to increase the $NF_3$ gas concentration in the CVD apparatus of FIG. 1 for conducting the cleaning process efficiently.

Further, FIG. 7 shows the relationship between the plasma sustaining power in the toroidal plasma generator 60 of FIG. 4 and the $NF_3$ concentration in the $Ar/NF_3$ mixed gas supplied to the plasma generator 60, wherein it should be noted that the experiment of FIG. 7, too, is made by the inventor of the present invention in the investigation constituting the foundation of the present invention. Thus, plasma generation is conducted under the condition in which the total pressure is set to 10 Torr and the total flow rate of the $Ar/NF_3$ mixed gas is set to 1500 SCCM.

Referring to FIG. 7, it can be seen that, once plasma is formed, it becomes possible to sustain the plasma even when the concentration of the $NF_3$ gas is increased, by increasing the supplied high-frequency power. On the other hand, the relationship of FIG. 7 also indicates that, when the concentration of the $Ar/NF_3$ mixed gas is increased, it becomes necessary to use a large high-frequency power in order to sustain the plasma. When the $NF_3$ concentration in the $Ar/NF_3$ mixed gas is zero, the plasma can be sustained with very small high-frequency power.

FIG. 8 shows the relationship between the plasma sustaining power in the toroidal plasma generator 60 of FIG. 4 and the total pressure of the $Ar/NF_3$ mixed gas supplied to the plasma generator 60. Again, the experiment of FIG. 8 was conducted by the inventor of the present invention in the investigation constituting the foundation of the present invention. Thus, in the experiment of FIG. 8, plasma was generated under the condition of setting the $NF_3$ concentration in the $Ar/NF_3$ mixed gas to 45% and the total flow rate of the $Ar/NF_3$ mixed gas to 1500 SCCM.

From FIG. 8, it can be seen that the plasma sustaining power in the $Ar/NF_3$ mixed gas decreases with decrease of the total pressure and that the plasma can be sustained with the high-frequency power of only about 3 kW when the total pressure about 333 Pa (2.5 Torr). On the other hand, when the total power is about 2000 Pa, it is necessary to feed the high-frequency power exceeding 4 kW for sustaining the plasma when the total pressure is about 2000 Pa (15 Torr).

Thus, with the toroidal plasma generator 60 of FIG. 4, it is possible to achieve plasma etching or plasma cleaning efficiently by supplying large high-frequency power under the condition of high $NF_3$ partial pressure or concentration, once the plasma has been ignited. However, as explained before, there is a problem with the plasma generator of the toroidal type in that ignition of plasma becomes difficult particularly when a gas containing an element of large electronegativity such as $NF_3$ is supplied. With the toroidal plasma generator 60 of FIG. 4, the plasma no longer ignites when a small amount of $NF_3$ gas is added to the Ar gas, or when the total pressure is increased slightly. This problem is also suggested from the relationship between the plasma sustaining power and the $NF_3$ concentration or partial pressure and the plasma sustaining power and the total pressure of FIGS. 7 and 8.

In order to circumvent this problem of plasma ignition, it has been practiced in the art to supply the Ar 100% gas at the time of ignition of the remote plasma source 16C and the etching gas containing fluorine is supplied after the plasma has been formed. Reference should be made to Patent Reference 1, for example. Further, plasma ignition has been conducted also in the experiments explained with reference to FIGS. 5-8 by using the Ar 100% gas at the time of the plasma ignition.

However, such a conventional approach requires sufficient purging of the cyclic gas passage 61 with regard to the $NF_3$ gas at the time of the plasma ignition for achieving plasma ignition, and there arises a problem of serious degradation of processing throughput with the fabrication of recent ultra miniaturized semiconductor devices such as the one fabricated with the design rule of 1 μm or less, in which there is needed frequent cleaning of the processing vessel. For example, a very long time would be needed for the substrate processing when cleaning of the processing vessel 11 is to be conducted each time a substrate has been processed.

Further, in any of the conventional plasma generators of FIGS. 2A-2F and FIG. 3, there is a need of applying a high drive voltage when plasma ignition is to be made in the state that a cleaning gas containing halogen is supplied to the plasma generator, in view of difficulty of plasma ignition as explained before. When such a high drive voltage is applied, however, there is caused a large impedance transition in the driving system including coils and electrodes at the moment the plasma ignition has occurred, and there is a substantial risk that overshooting of the drive voltage damages the foregoing driving system or high-frequency power source.

Thus, the present invention has its general object of providing a novel and useful plasma ignition method and a method of cleaning and substrate processing method wherein the foregoing problems are eliminated.

Another object of the present invention is to provide a plasma ignition method that can achieve plasma ignition for a mixed gas of an Ar gas and an $NF_3$ gas while using a toroidal plasma generator, and a substrate processing method that uses such a toroidal plasma generator.

Another object of the present invention is to provide a plasma cleaning method capable of igniting plasma at low voltage and thus capable of avoiding high-voltage damaging in power supplies, coils, electrodes, and the like.

Means of Solution of the Problems

The present invention provides a method of generating plasma in a toroidal plasma generator, said toroidal plasma generator comprising a gas passage having a gas entrance and a gas outlet, said gas passage forming a circuitous path, and a coil wound around a part of the gas passage, characterized in that said method comprises the steps of supplying a mixed gas of an Ar gas and an $NF_3$ gas containing at least 5% of said $NF_3$ gas, and igniting plasma by driving said coil with a high-frequency power, said step of igniting plasma being conducted under a total pressure of 6.65-66.5 Pa.

Further, the present invention provides a toroidal plasma generator, said toroidal plasma generator comprising a gas passage having a gas entrance and a gas outlet, said gas passage forming a circuitous path, and a coil would around a part of said gas passage, characterized in that said method comprises the steps of supplying a mixed gas of an Ar gas and a $F_2$ gas containing at least 5% of said $F_2$ gas, and igniting plasma by driving said coil with a high-frequency power, said step of igniting plasma being conducted under a total pressure of 6.65-66.5 Pa.

Further, the present invention provides a cleaning method for cleaning a processing vessel evacuated by an evacuating system and coupled with a remote plasma source, said remote plasma source comprising a toroidal plasma generator, said toroidal plasma generator comprising a gas passage having a gas entrance and a gas outlet, said gas passage forming a circuitous path, and a coil would around a part of said gas passage, characterized in that said cleaning method comprises the steps of:

forming radicals containing F in said remote plasma source; and supplying said radicals to an interior of said processing vessel and cleaning said interior of said processing vessel by said radicals, said step of forming said radicals comprising the steps of:

supplying a mixed gas containing at least 5% of $NF_3$ or $F_2$ in an Ar gas to said gas passage as a cleaning gas with a first pressure in which plasma can ignite and igniting plasma by driving said coil by a high-frequency power; and increasing a total pressure of said mixed gas in said gas passage to a second pressure while maintaining said plasma, said cleaning step cleaning said interior of said processing vessel at said second pressure.

Further, the present invention provides a substrate processing method in a processing vessel evacuated by an evacuation system and coupled with a remote plasma source, said remote plasma source comprising a toroidal plasma generator comprising a gas passage having a gas entrance and a gas outlet and forming a circuitous path, and a coil would around a part of said gas passage, said substrate processing method comprising the steps of:

forming radicals containing F in said remote plasma source; and etching a surface of a substrate to be processed in said processing vessel by said radicals by supplying said radicals to an interior of said processing vessel, said step of forming said radicals comprising the steps of:

supplying a mixed gas containing $NF_3$ or $F_2$ in an Ar gas with a concentration of at least 5% to said gas passage under a first pressure in which ignition of plasma is possible and igniting plasma by driving said coil with a high-frequency power; and increasing a total pressure of said mixed gas in said passage to a second pressure while maintaining said plasma, said step of etching being conducted under said second pressure.

Further, the present invention provides a cleaning method for cleaning an interior of a processing vessel by plasma-excited radicals of a cleaning gas under a first pressure zone, characterized in that said method comprises the steps of:

introducing a mixed gas of a diluting gas and a cleaning gas to a plasma generator under a second pressure lower than said first pressure and igniting plasma; and increasing a pressure inside said processing vessel to said first pressure zone from said second pressure zone.

Further, the present invention provides a substrate processing method for etching a surface of a substrate to be processed by plasma-excited radicals under a first pressure zone, comprising the steps of:

introducing a mixed gas of a diluting gas and an etching gas into a plasma generator under a second pressure lower than said first pressure and igniting plasma; and increasing a pressure inside said processing vessel to said first pressure zone from said second pressure zone.

Further, the present invention provides a cleaning method for cleaning an interior of a processing vessel by plasma-excited radicals of a cleaning gas under a first pressure zone, comprising the steps of:

introducing a mixed gas of a diluting gas and a cleaning gas into a plasma generator under a second flow rate zone smaller than said first flow rate zone and igniting plasma; and increasing a flow rate of said mixed gas from said first flow rate zone to said second flow rate zone.

Further, the present invention provides a substrate processing method for etching a surface of a substrate to be processed in a processing vessel by plasma-excited radicals of etching under a first flow rate zone, comprising the steps of:

introducing a mixed gas of a diluting gas and an etching gas into a plasma generator under a second flow rate zone smaller than said first flow rate zone and igniting plasma; and increasing a flow rate of said mixed gas from said second flow rate zone to said first flow rate zone.

Effect of the Invention

According to the present invention, it becomes possible with a toroidal plasma generator to ignite plasma by a high-frequency power under a total pressure of 6.65-66.5 Pa while supplying a mixed gas of an Ar gas and a $NF_3$ gas containing at least 5% of $NF_3$ and thus it becomes possible to ignite plasma for an Ar/$NF_3$ mixed gas. As a result, it becomes possible to eliminate the purging process of an $NF_3$ gas from a remote plasma source, which has been necessary in single-wafer substrate processing systems whenever there is a need of turning plasma on and off, and it becomes possible to improve the throughput of cleaning or substrate processing significantly. Once the plasma has been ignited, it becomes possible to move from a ignition point of plasma to a processing point where cleaning or etching processing is conducted, without extinguishing the plasma, and efficient plasma process becomes necessary.

Further, according to the present invention, it becomes possible to ignite plasma with low voltage even in a gas containing a halogen compound, by decreasing the gas pressure at the time of plasma ignition. With this, it becomes possible to avoid occurrence of large voltage overshoot caused by large impedance change occurring at the moment of plasma ignition and associated problems of damaging in the driving power source, electrodes or coils. Further, with the present invention, it becomes possible to carry out the desired cleaning process or etching process efficiently after such ignition of plasma, by increasing the gas pressure to a predetermined process condition while sustaining plasma. Further, according to the present invention, it becomes possible to ignite plasma in the gas containing a halogen compound, and thus, the need of purging the gas containing halogen compound each time plasma is to be ignited is no longer necessary in the process where there is a need of turning on and turning off the plasma frequently, as in the case of single-wafer process, and the throughput of cleaning or substrate processing is improved significantly.

REFERENCE NUMERALS

Figure 1:
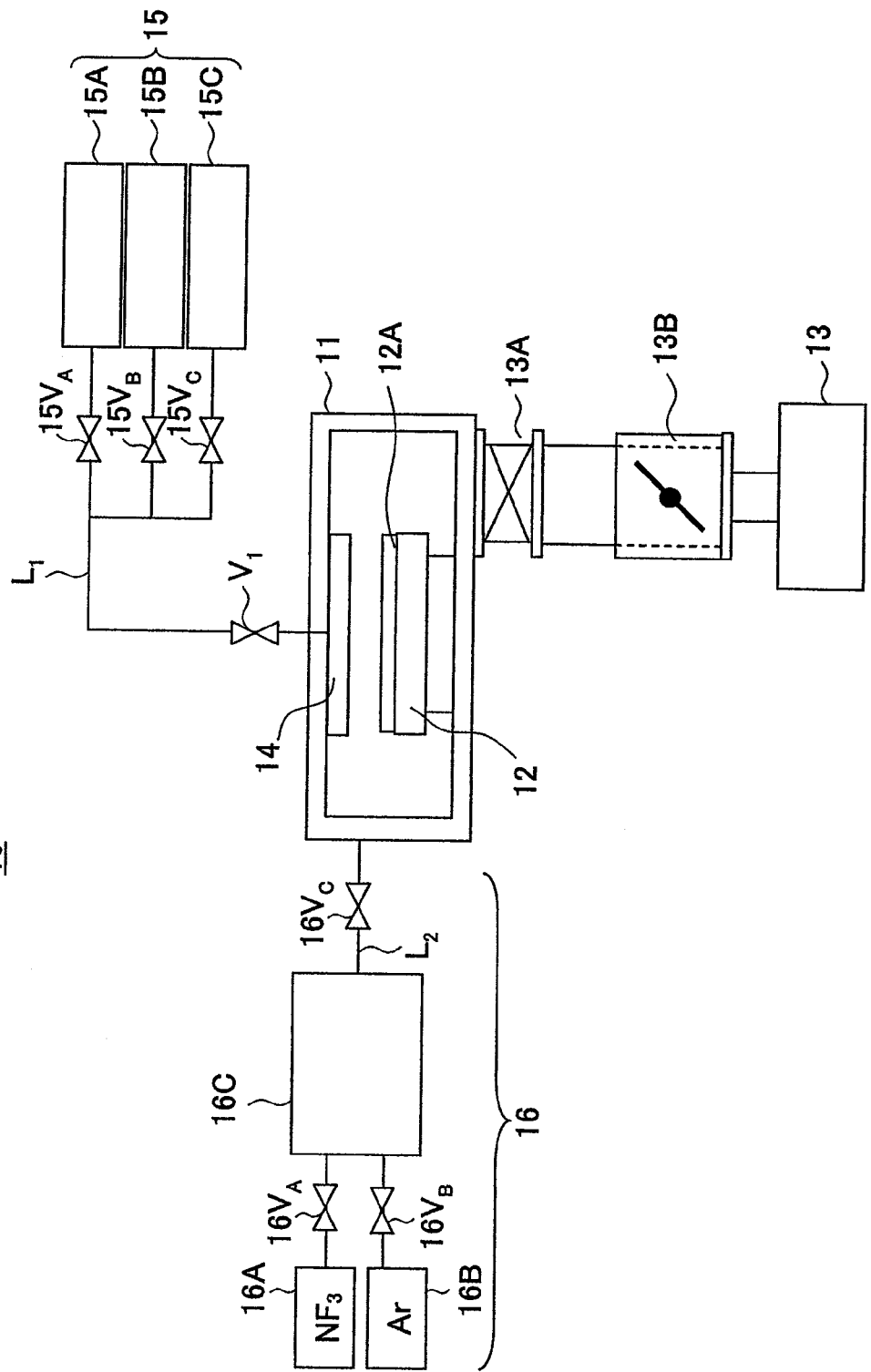
FIG. 1 is a diagram showing the construction of a CVD apparatus to which the present invention is applied.
Figure 2A:
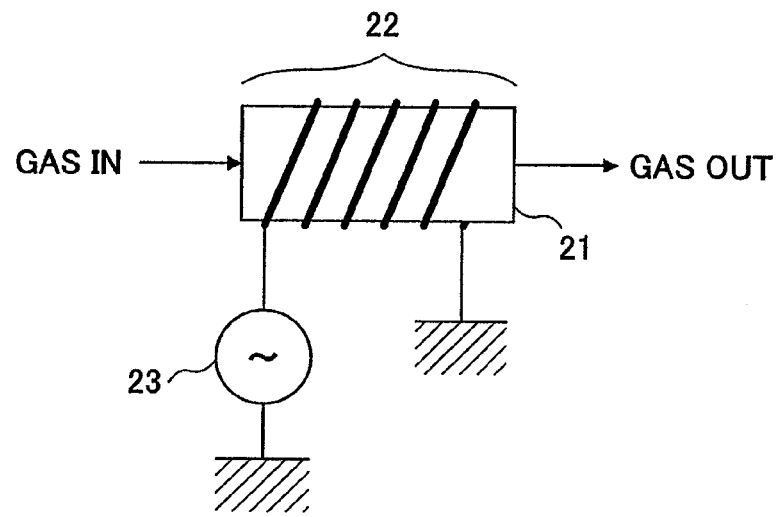
FIG. 2A is a diagram showing the outline of a conventional induction-coupled plasma generator.
Figure 2B:
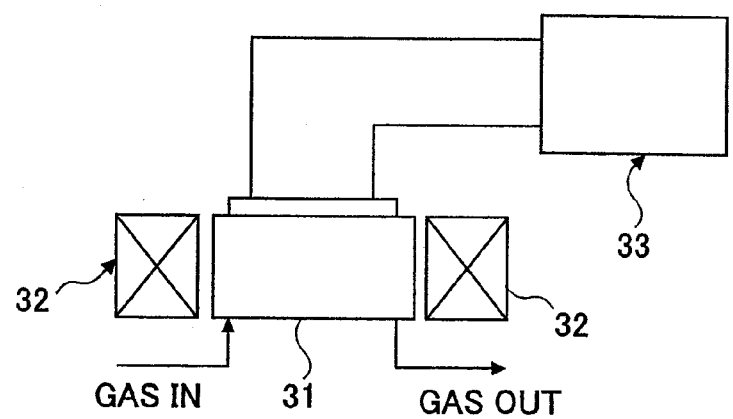
FIG. 2B is a diagram showing the outline of a conventional electron cyclotron resonance plasma generator.
Figure 2C:
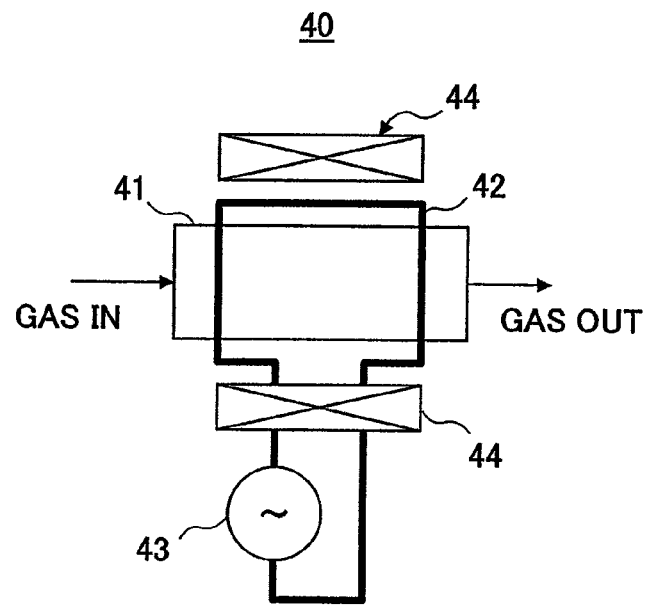
FIG. 2C is a diagram showing the outline of a conventional helicon-wave excitation plasma generator.
Figure 2D:
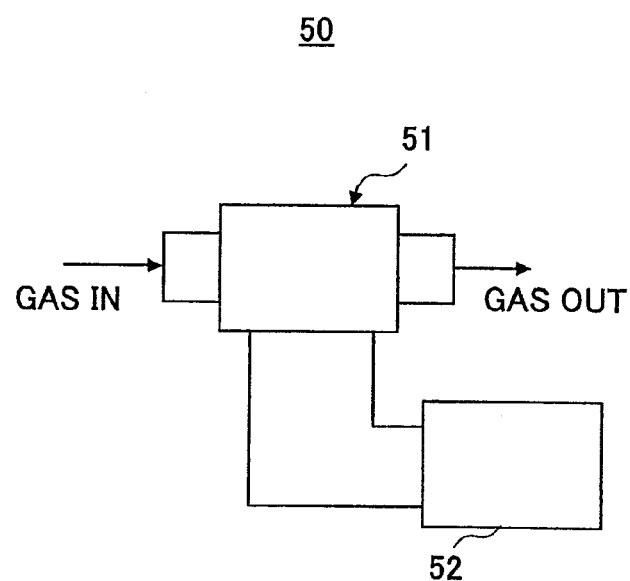
FIG. 2D is a diagram showing the outline of a conventional microwave cavity plasma generator.
Figure 2E:
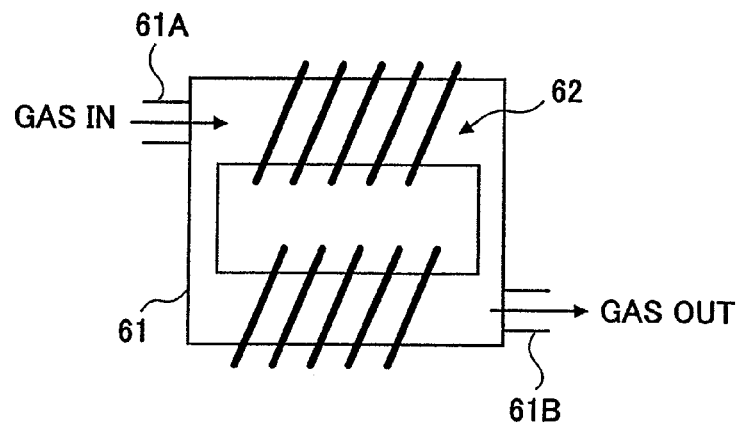
FIG. 2E is a diagram showing the outline of a conventional toroidal plasma generator.
Figure 3:
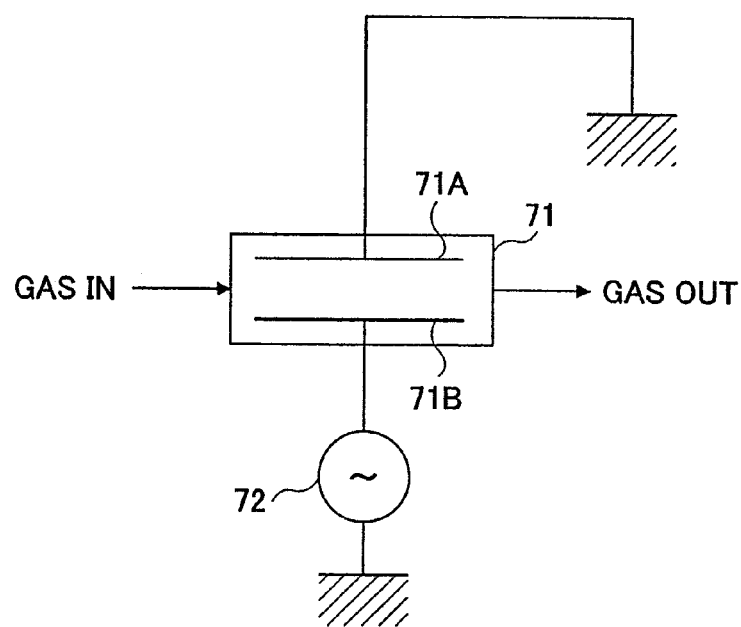
FIG. 3 is a diagram showing the outline of a conventional capacitive-coupling plasma generator.

10 CVD apparatus
11 processing vessel
12 susceptor
13 vacuum pump
13A block valve
13B conductance valve
14 shower head
15 source gas supply system
15A-15C source material gas source
15V$_A$-15V$_C$ valve
16 cleaning module
16A cleaning gas source
16B Ar gas source
16a-16d mass flow rate controller
16C remote plasma source
16VA-16VC valve
20 ICP plasma generator
21 plasma vessel
22 coil
23 high-frequency power supply
30 ECR plasma generator
31 plasma vessel
32 magnet
33 microwave power supply
40 helicon wave plasma generators
41 plasma vessel
42 loop antenna
43 high-frequency power supply
44 magnet
50 microwave cavity plasma generator
51 microwave cavity
52 microwave power supply
60 toroidal plasma generator
61 gas passage
61A gas entrance
61B gas exit
62 high frequency coil
70 capacitive-coupled plasma generator
71 plasma vessel
71A, 71B electrode
72 high-frequency power supply
L1 source gas line
L2 cleaning gas line

BEST MODE FOR IMPLEMENTING THE INVENTION

First Embodiment

Hereinafter, explanation of the present invention will be made with regard to preferred embodiments.

As explained previously, a toroidal plasma generator has an advantageous feature of reduced contamination in the substrate processing that uses plasma because of suppressed sputtering at the wall surface of the plasma generator, while there is a drawback in that plasma ignition is difficult. Thus there has been a need, when to carry out plasma ignition, of eliminating the etching gas or cleaning gas containing halogen having a large electronegativity such as $NF_3$ and conduct the plasma ignition in an ambient of Ar gas 100%.

Thus, it has been recognized commonly that, with toroidal plasma generator, plasma ignition is possible only in the ambient of 100% Ar gas. Contrary to this, it came to the attention of the inventor of the present invention that average mean path length of electrons is increased under low pressure environment and predicted that electrons would acquire large energy also with toroidal plasma generators when a high frequency electric filed is applied under the low pressure environment such as the one used for ordinary cleaning process or etching process, as a result of large acceleration caused by the electric field, and that there would be a possibility that the plasma is ignited even when a gas containing halogen having large electronegativity such as $NF_3$ is added to the Ar gas under the circumstances in which the electrons have large energy.

Figure 4:
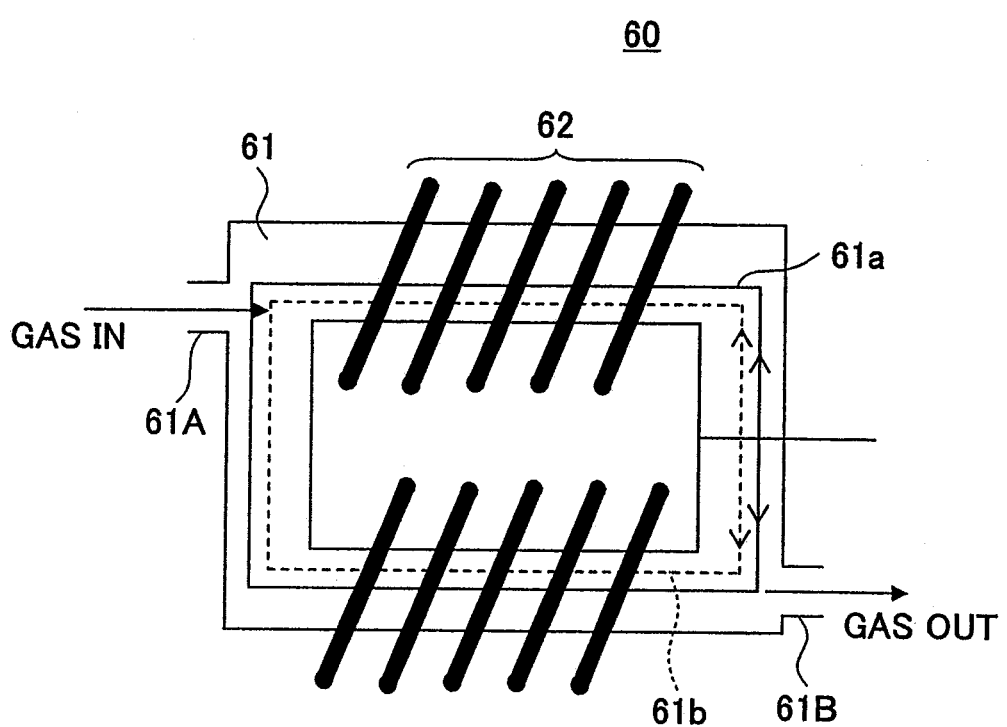
FIG. 4 is a diagram showing the construction of a conventional toroidal plasma generator used with the CVD apparatus of FIG. 1.
Figure 9:
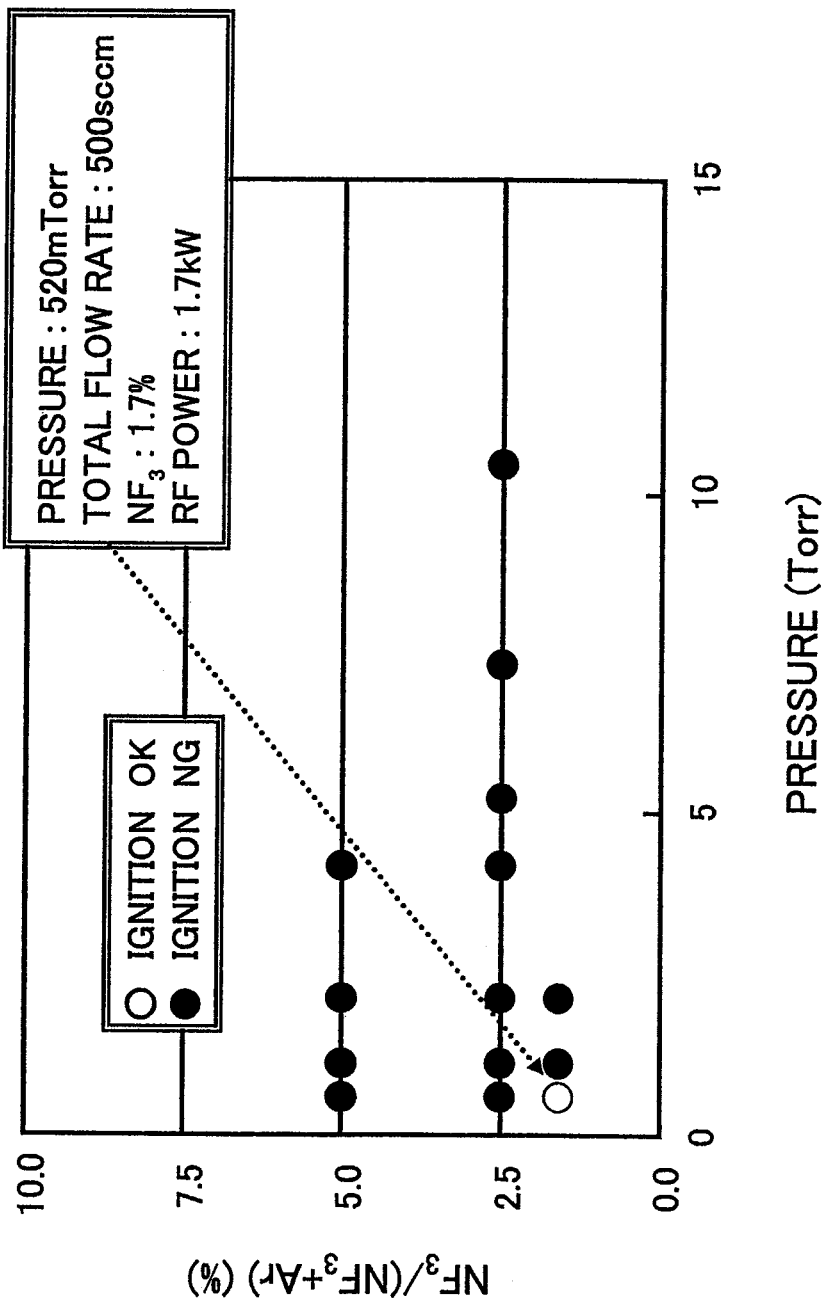
FIG. 9 is a diagram explaining the search of plasma ignition condition according to a first embodiment of the present invention.

FIG. 9 shows the result of the search made for the plasma ignition condition with regard to the toroidal plasma generator 60 of FIG. 4 (ASTRON i manufactured by MKS, U.S. Pat. No. 6,150,628) in the investigation made by the inventor of the present invention and constituting the foundation of the present invention based on the foregoing conception, by changing the $NF_3$ concentration in the $Ar/NF_3$ mixed gas variously and by changing the total pressure variously.

Referring to FIG. 9, the solid circles represent the points where the plasma ignition did not take place. Thus, it can be seen that no plasma ignition was observed in any experimented pressures when the $NF_3$ concentration is 2.5% or more. On the other hand, when the $NF_3$ concentration is set to 1.7%, it was discovered that there occurs plasma ignition when the total pressure is reduced to 69 Pa (520 mTorr) as represented in the drawing by an open circle. In the experiment of FIG. 9, it should be noted that the total flow rate of the $Ar/NF_3$ mixed gas is set to 500 SCCM and a high-frequency power of 1.7 kW is supplied.

Figure 10:
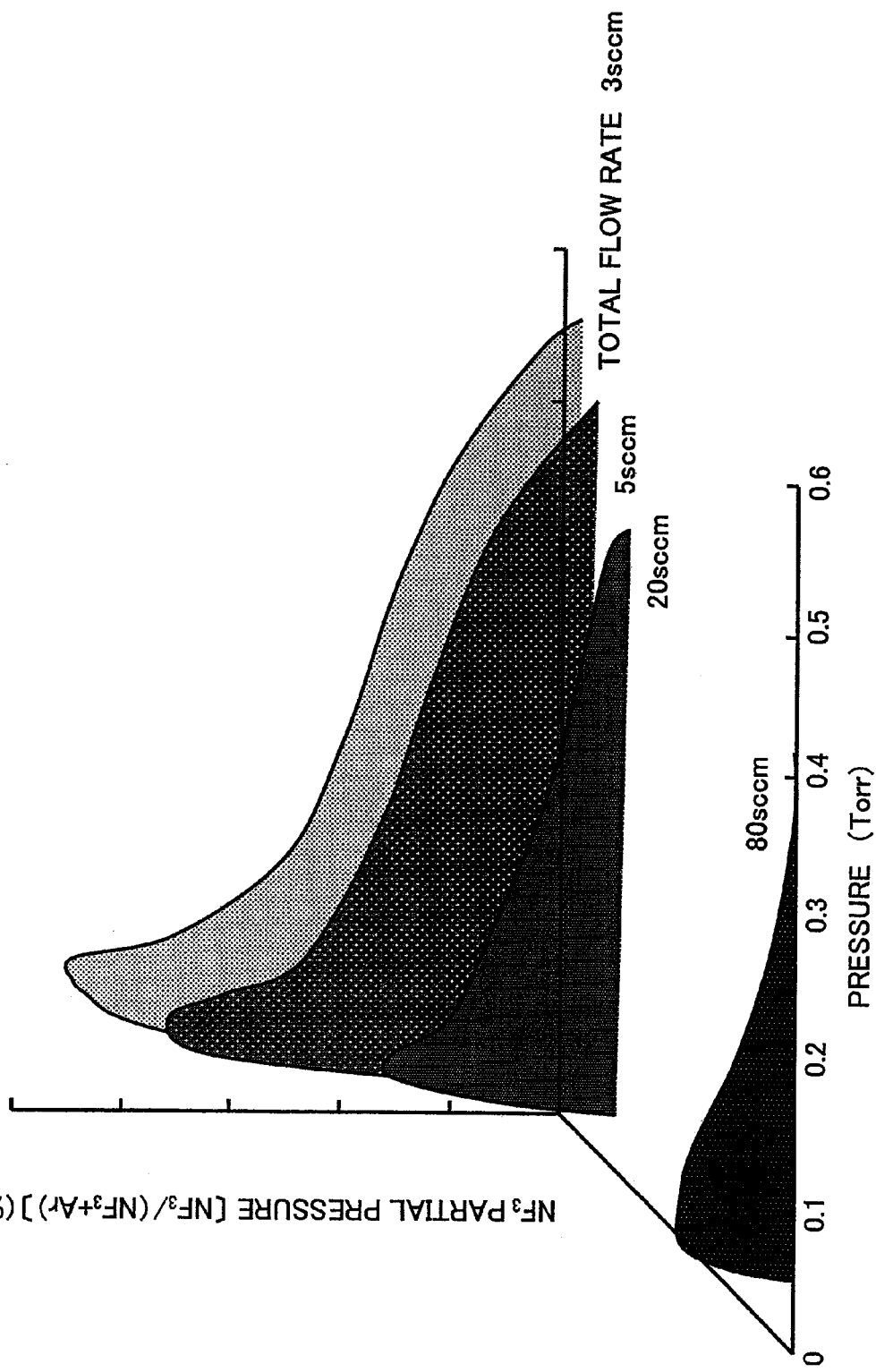
FIG. 10 is a diagram showing the plasma ignition condition discovered with the first embodiment of the present invention.

Thus, with regard to the toroidal plasma generator 60 of FIG. 4, the plasma ignition points have been searched for, starting from the ignition point thus discovered while changing the total pressure, the flow rate and the $NF_3$ concentration in the mixed gas variously, and the result of FIG. 10 was obtained. In the experiment of FIG. 10, it should be noted that a high-frequency power of 400 kH frequency is supplied with the power of 1500 W.

Referring to FIG. 10, the vertical axis represents the $NF_3$ concentration in the $Ar/NF_3$ mixed gas (=$NF_3/(Ar+NF_3)$), while the horizontal axis represents the total pressure in the gas passage 21. The shaded area represents the conditions in which plasma ignition is possible.

Thus, with decrease of the total pressure in the gas passage 21, it can be seen that the range of the $NF_3$ concentration that allows plasma ignition increases and that the range of the $NF_3$ concentration that allows plasma ignition increases also with decrease of the total flow rate of the $Ar/NF_3$ mixed gas.

On the other hand, when the total pressure in the gas passage 61 becomes too low, the probability of the accelerated electrons colliding with an Ar atom or an $NF_3$ molecule is decreased, and ignition of plasma becomes difficult.

From FIG. 10, it is concluded that plasma ignition becomes possible in an $Ar/NF_3$ mixed gas that contains $NF_3$ with 5% or more, by decreasing the total pressure in the gas passage 61 at the time of the plasma ignition to 66.5 Pa (0.5 Torr) or less, preferably 6.65 Pa (0.05 Pa) or less, and that there can be a case in which plasma ignition is possible even when the $NF_3$ concentration in the $Ar/NF_3$ mixed has as reached 45%.

Further, FIG. 10 shows the tendency of the $NF_3$ concentration range in which plasma ignition is possible to increase by decreasing the flow rate of the $Ar/NF_3$ mixed gas supplied to the toroidal plasma generator at the time of plasma ignition. For example, in the case the gas flow rate of the $Ar/NF_3$ mixed gas is 80 SCCM, there does occur plasma ignition, while the $NF_3$ concentration range or pressure range in which the plasma ignition takes place is limited. However, it can be seen that the concentration range of $NF_3$ or the pressure range that enables plasma ignition expands when the gas flow rate is decrease from 20 SCCM to 5 SCCM and further to 3 SCCM. Further, it should be noted that plasma ignition is confirmed even when the mixed gas contains $NF_3$ with about 5%, provided that the gas flow rate of the $Ar/NF_3$ mixed gas is 100 SCCM or less.

Figure 11:
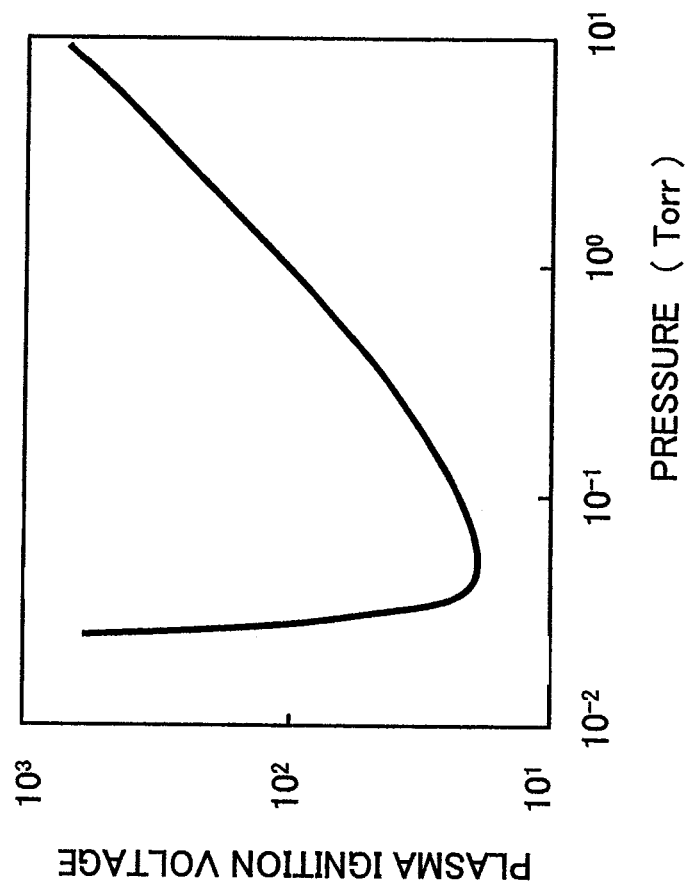
FIG. 11 is a diagram showing the relationship between the plasma ignition voltage and the total pressure discovered with the first embodiment of the present invention.

FIG. 11 shows the relationship between the plasma ignition voltage and the total pressure obtained for the toroidal plasma generator 60 of FIG. 4 based on the results of FIGS. 9 and 10.

Referring to FIG. 11, the illustrated example is for the case in which the $Ar/NF_3$ mixed gas contains $NF_3$ with about 5%, wherein it can be seen that the plasma ignition voltage decreases with decrease of the total pressure and takes the minimum value at the pressure generally corresponding to the ignition point shown in FIG. 9 by the open circle. When the pressure is decreased further, however, there occurs a decrease of collision probability, and the plasma ignition voltage increases sharply.

The relationship of FIG. 11 also + indicates that plasma ignition would be possible even when the total pressure of the mixed gas is very high or very low, by applying a sufficient voltage exceeding the curve shows in FIG. 11. However, in actual plasma generators, there exist limitations with regard to the design and cost, and practical pressure range for plasma ignition is limited to the range of approximately 6.65-66.5 Pa (0.05-0.5 Torr).

Thus, according to the present embodiment, it becomes possible to ignite plasma in a toroidal plasma generator even in the case of using an $Ar/NF_3$ mixed gas containing $NF_3$ by 5% or more. Thereby, there is no need of purging the $NF_3$ cleaning gas from the interior of the processing vessel in a single-wafer substrate processing apparatus, or the like, frequently, or each time one wafer is processed, for igniting plasma for the purpose of cleaning the interior of the processing vessel. With this, the throughput of substrate processing is improved significantly. Further, similar advantage is achieved also in the single-wafer plasma etching apparatuses that carry out etching of a substrate to be processed one by one while using an $NF_3$ gas.

Second Embodiment

Figure 12:
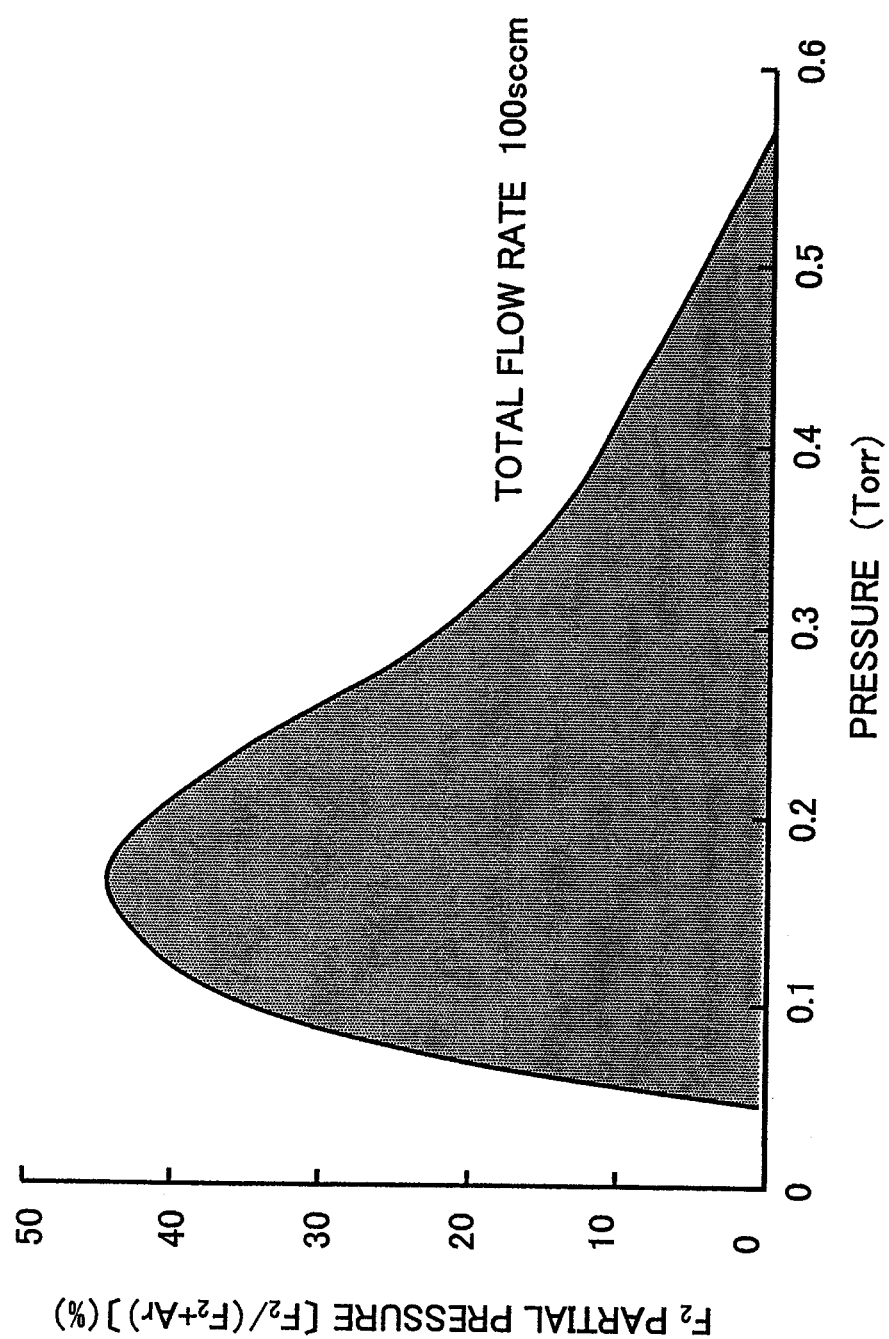
FIG. 12 is a diagram showing the plasma ignition condition for an $Ar/F_2$ gas according to a second embodiment of the present invention.

FIG. 12 shows the result of search for the plasma ignition condition for the case a mixed gas of Ar and $F_2$ is supplied to the toroidal plasma generator 60 of FIG. 4 under various $F_2$ concentrations ($F_2/(Ar+F_2)$) according to the procedure similar to that of FIG. 9, as a second embodiment of the present invention.

In the experiment of FIG. 12, it should be noted that the flow rate of the $Ar/F_2$ mixed gas is set to 100 SCCM and the high-frequency power of 400 kHz frequency is supplied with the power of 1300 W.

Referring to FIG. 12, it can be seen that, in the case the total gas flow rate is set to 100 SCCM and the $F_2$ concentration in the mixed gas is 5%, plasma ignition takes place in the pressure range of approximately 6.65 Pa (0.05 Torr) or more but not exceeding approximately 66.5 Pa (0.5 Torr), and that this pressure range enabling plasma ignition decreases with increasing $F_2$ concentration in the mixed gas. Still, plasma ignition is possible up to the $F_2$ concentration of about 45%.

Third Embodiment

Thus, the inventor of the present invention has discovered, with the investigation that constitutes the foundation of the present invention, that plasma ignition is still possible with a toroidal plasma generator such as the one shown in FIG. 4, even in the case a mixed gas in which a gas containing halogen of large electronegativity such as $NF_3$ or $F_2$ is added to an Ar gas, is supplied to the plasma generator. Further, the inventor of the present invention has succeeded in finding out the condition enabling the plasma ignition.

On the other hand, the pressure or gas flow rate used in actual CVD apparatuses such as the CVD apparatus 10 of FIG. 1 for the cleaning process or etching process is much larger than the ignition point shown in FIG. 9 or 10, and thus, the toroidal plasma generator 60 is required to change the process condition, after the plasma ignition at the ignition point of FIG. 9 or 10, to the process point where the actual process is conducted, without extinguishing the plasma. For example, according to FIG. 5 or 6 explained previously, it can be seen that it is necessary to set the $NF_3$ concentration in the $Ar/NF_3$ mixed gas to 50% or more, and the pressure (total pressure) to be 1330 Pa (10 Torr) or more, in order to achieve the cleaning rate of 150 or 200 nm per minute.

Thus, in the investigation that constitutes the foundation of the present invention, the inventor of the present invention has verified whether or not the plasma is sustained from an ignition point (1) corresponding to the ignition point explained in FIG. 9 or 10 to a process point (2) where the actual cleaning or etching process is conducted for the CVD apparatus 10 of FIG. 1, by changing the total pressure and flow rate of the $Ar/NF_3$ mixed gas according to various paths. In this experiment, it should be noted that the valve 16Vc is fully opened with the CVD apparatus 10 of FIG. 1, and thus, the pressure in the gas passage 21 of the toroidal plasma generator 20 of FIG. 2 used for the remote plasma source 16C and the pressure inside the processing vessel 11 are substantially identical.

Figure 13:
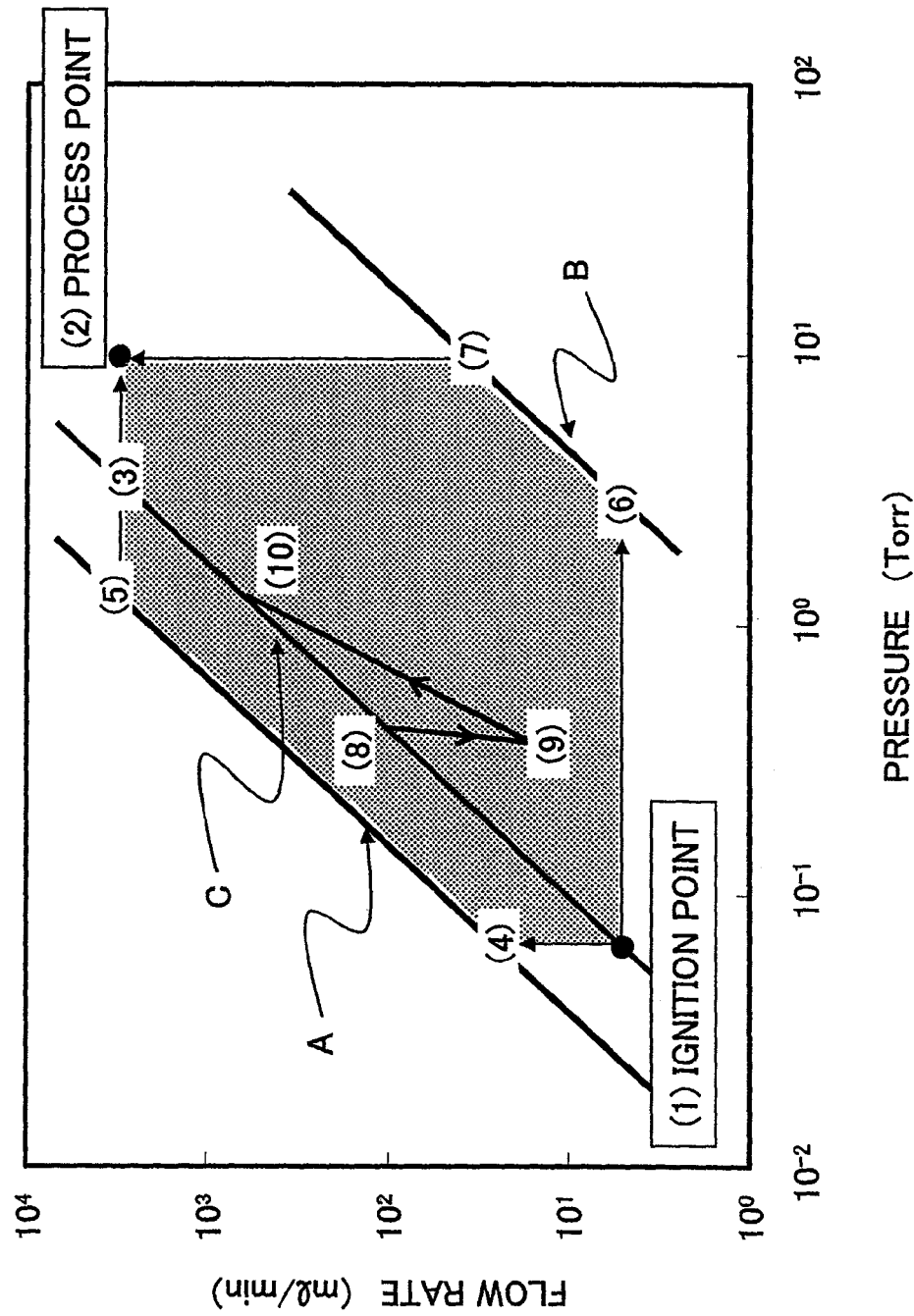
FIG. 13 is a diagram showing the moving from the plasma ignition point to the processing point of plasma cleaning or plasma etching according to a third embodiment of the present invention.

In the experiment of FIG. 13, it should be noted that the total pressure at the ignition point (1) is set to about 11 Pa (0.08 Torr) and the total flow rate of the $Ar/NF_3$ mixed gas is set to 3 SCCM. Further, total pressure at the process point (2) is set to 1330 Pa (10 Torr) and the total flow rate of the $Ar/NF_3$ mixed gas is set to 3 LM.

Referring to FIG. 13, a path A starts from the ignition point (1) and reaches a point (4) by increasing the gas flow rate while maintaining the foregoing pressure of about 11 Pa (0.08 Torr). Thus, the conductance valve 13B of the evacuation system is opened gradually with the CVD apparatus 10 of FIG. 1 such that the pressure inside the processing vessel 11 is maintained constant even when the flow rate of the $Ar/NF_3$ mixed gas is increased. In the point (4), the conductance valve 13B is in fully opened. Thus, the point (4) is determined by the power of the conductance valve 13B and the vacuum pump 13 cooperating therewith.

When the flow rate of the $Ar/NF_3$ mixed gas is increased gradually to a predetermined processing flow rate corresponding to the process point (2), the pressure inside the processing vessel 11, and hence the total pressure in the gas passage 61 is increased, and a point (5) is reached. From this point, the conductance valve 13B is closed gradually while maintaining the flow rate of the $Ar/NF_3$ mixed gas, and the pressure inside the processing vessel 11, and hence the pressure inside the gas passage 61, increases gradually to the process point (2).

In the case of a path B of FIG. 13, on the other hand, the pressure inside the processing vessel 11, and hence the total pressure in the gas passage 61, is increased gradually, by gradually closing the conductance valve 13B while maintaining the flow rate of the $Ar/NF_3$ mixed gas. When the conductance valve 13B is fully closed, the point (6) is reached. Thus, the point (6) is determined by the gas leak amount in the fully closed state of the conductance valve 13B and the power of the vacuum pump 13.

Further, with the path B, the flow rate of the $Ar/NF_3$ mixed gas is increased while maintaining the fully closed state of the conductance valve 13B. With this, the pressure inside the processing vessel 11, and hence the total pressure in the gas passage 61, is increased gradually, and a point (7) corresponding to the process pressure of the point (2) is reached. Further, the flow rate of the $Ar/NF_3$ mixed gas is increased gradually from the point (7) to the process point (2). Thereby, the conductance valve 13B is gradually closed and the pressure inside the processing vessel 11, and hence the total pressure in the gas passage 61, is maintained to the foregoing process pressure.

In a path C of FIG. 11, on the other hand, the plasma is ignited at first at the ignition point (1), and the flow rate of the $Ar/NF_3$ mixed gas is increased thereafter to a point (3) corresponding to a predetermine processing flow rate while maintaining the valve opening degree of the conductance valve 13B constant. Thereafter, the conductance valve 13B is closed gradually and the pressure inside the processing vessel 11, and hence the total pressure in the gas passage 61, is increased to the foregoing process point (2).

Thus, as a result of the experiments thus conducted for changing the gas flow rate and the total pressure from the ignition pint (1) to the process point (2) along various paths, it was confirmed that the ignited plasma is not extinguished even when the total pressure and the gas flow rate are changed, as long as the condition falls in the region surrounded by the foregoing points (1)-(7) in FIG. 13.

As already explained, the points (4) and (6), and hence the path from the point (4) to the point (5), and from the point (6) to the point (7), are determined by the designing of the conductance valve 13B of the CVD apparatus and the power of the vacuum pump 13, and thus, the path from the point (4) to the point (5) shifts in the direction toward increased flow rate when the maximum conductance of the conductance valve 13B is increased or the power of the vacuum pump 13 is increased. Further, the path from the point (6) to the point (7) moves toward the side of higher pressure when the minimum conductance of the conductance valve 13B is decreased or the power of the vacuum pump 13 is decreased.

Thus, the process point (2) can be set to any of the conditions explained previously with reference to FIGS. 5-9.

Figure 5:
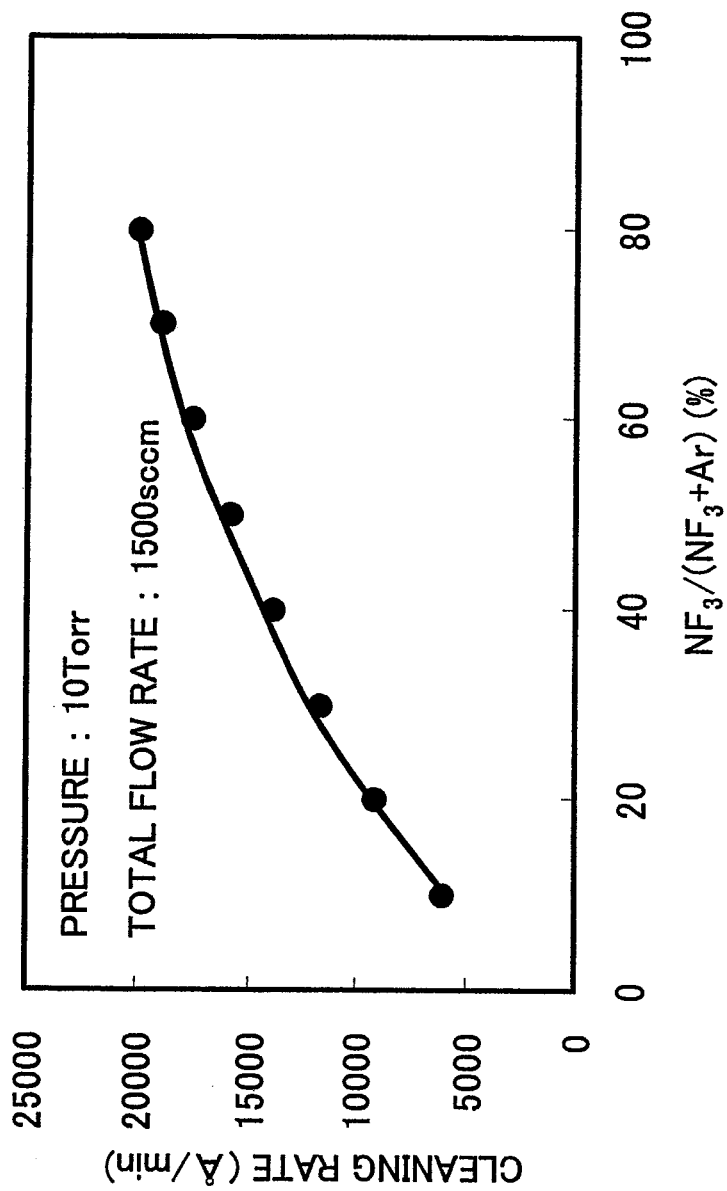
FIG. 5 is a diagram showing the relationship between the NF3 concentration in the $Ar/NF_3$ mixed gas used with the plasma cleaning process and the cleaning rate.
Figure 6:
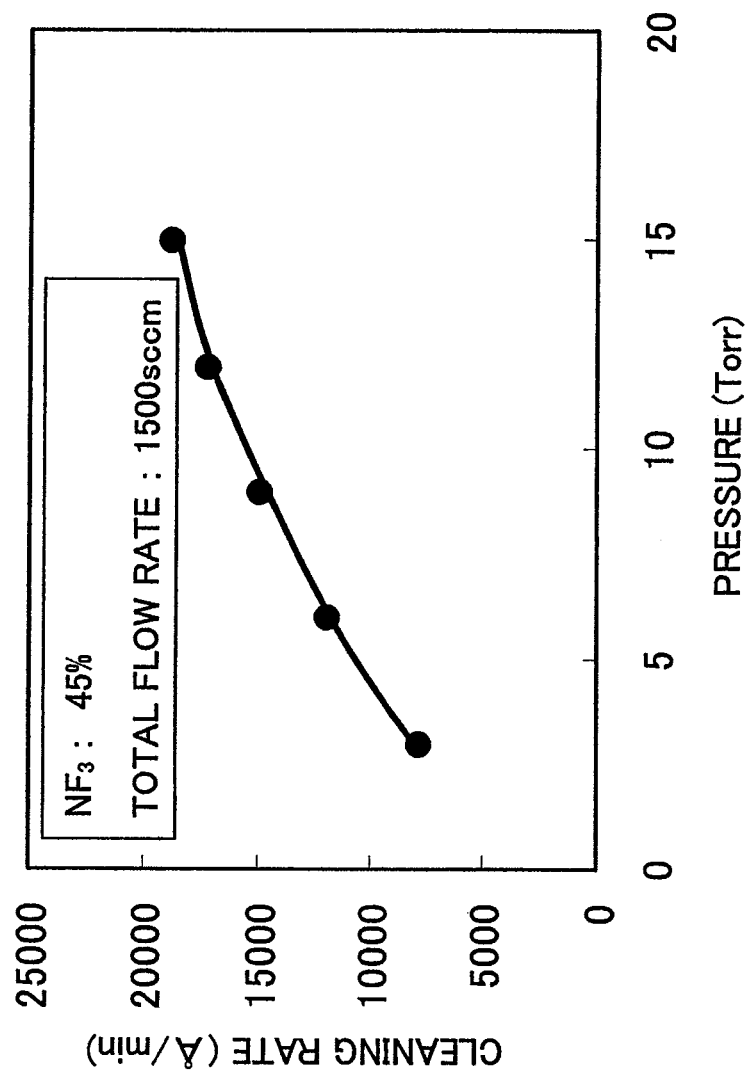
FIG. 6 is a diagram showing the relationship between the total pressure of the $Ar/NF_3$ mixed gas used with the plasma cleaning process and the cleaning rate.
Figure 7:
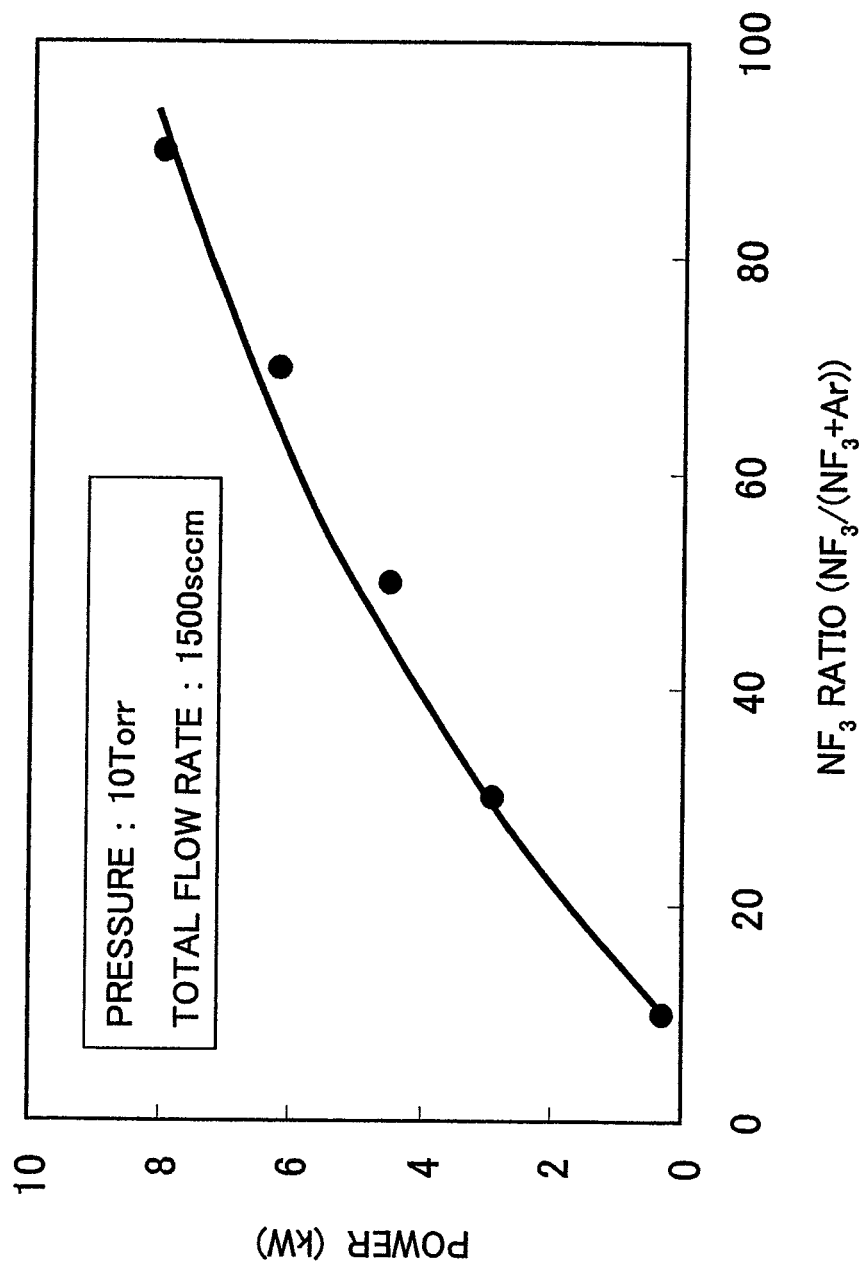
FIG. 7 is a diagram showing the relationship between the NF3 concentration in the $Ar/NF_3$ mixed gas used with a plasma cleaning process and the plasma sustaining power.
Figure 8:
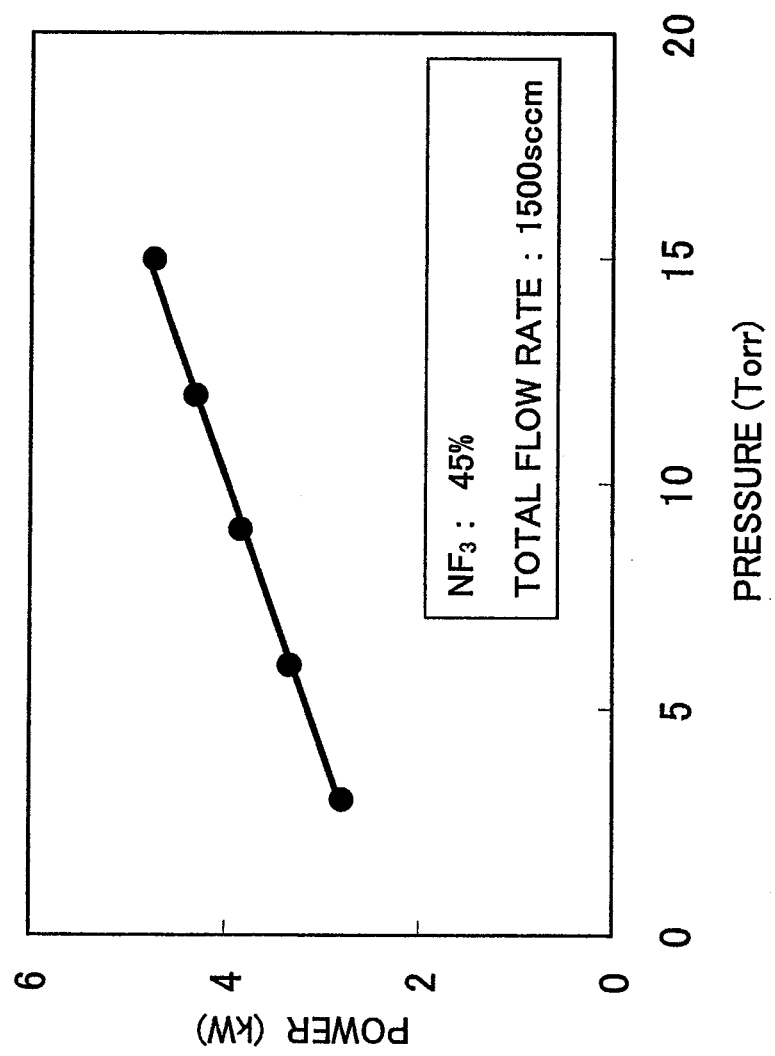
FIG. 8 is a diagram showing the relationship between the total pressure of the $Ar/NF_3$ mixed gas used with the plasma cleaning process and the plasma sustaining power.

Thus, it is possible to achieve the cleaning rate of 2000 nm per minute for a thermal oxide film by increasing the $NF_3$ concentration in the Ar/NF3 mixed gas to 80% at the process point (2) as shown in FIG. 5. In this case, there is a need of changing the $NF_3$ concentration in the $Ar/NF_3$ mixed gas when moving from the ignition point (1) to the process point (2). Even in such a case, it is confirmed that the plasma is sustained once it is ignited.

Once the condition has reached the process point (2), it is possible to conduct ordinary cleaning process. In the CVD apparatus 10 of FIG. 1, it should be noted that the cleaning is already started when the plasma ignition has occurred in the toroidal plasma generator 20 used for the remote plasma source 16C.

As explained previously, the mixing ratio of the Ar gas and the $NF_3$ gas in the $Ar/NF_3$ mixed gas may be fixed or may be changed when moving from the ignition point (1) to the process point (2) in FIG. 13. Thereby, because the cleaning has been started immediately after the ignition of the plasma, it is not only possible to increase but also decrease the $NF_3$ concentration in the $Ar/NF_3$ mixed gas according to the needs when moving from the ignition point (1) to the process point (2).

Further, with the CVD apparatus 10 of FIG. 1, it is possible to use the toroidal plasma generator 20 as a remote plasma source 16C and conduct plasma etching of an insulation film such as a thermal oxide film or a CVD oxide film, plasma etching of a metal film such as a W film or a Ti film, plasma etching of a conductive nitride film such as a TiN film, or plasma etching of a polysilicon film, inside the processing vessel 11.

Figure 14:
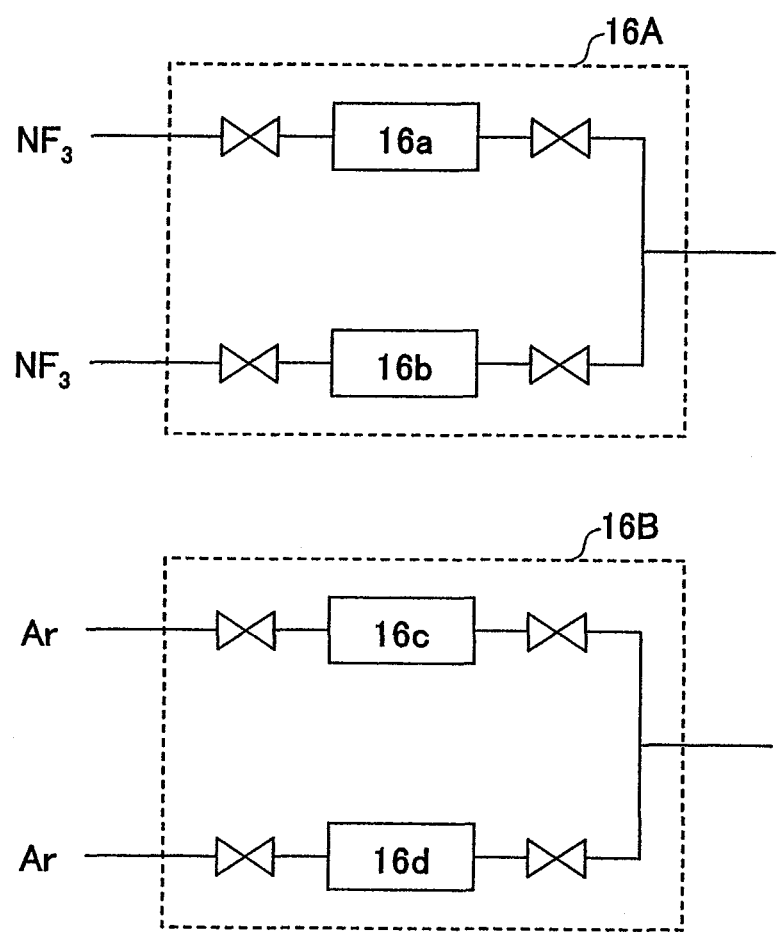
FIG. 14 is a diagram showing the construction of a gas flow rate switching mechanism used with the third embodiment of the present invention.

Further, With the present embodiment, it is also possible to provide mass flow controllers 16a and 16b of different capacities to the NF$_3$ gas source as shown in FIG. 14 and switch the mass flow controllers 16a and 16b during the use. In the example of FIG. 13, there are also provided plural mass flow controllers 16c and 16d of different capacities in the Ar gas source 16B, wherein these mass flow controllers 16c and 16d are switched during the use thereof.

Thus, consider the case of increasing the flow rate of the Ar/NF$_3$ mixed gas first from the ignition point (1) of FIG. 13 along the path C by the mass flow controller 16a and switch the mass flow controller 16a to the mass flow controller 16b of higher capacity at a point (8) on the path C. In such a case, there can occur a situation in which the flow rate and the total pressure are lowered to a point (9) with such switching of the mass flow controller, while it is possible to recover the state corresponding to a point (10) on the path C by driving the mass flow controller 16b of larger capacity. Thereby, according to the preset embodiment, the plasma ignited at the point (1) is not extinguished as long as the point (9) is located in the plasma sustaining region represented in FIG. 11.

Further, the point (10) after the recovery is not limited to the location on the path C but can be chosen arbitrarily in the foregoing plasma sustaining area, as long as the flow rate is larger than the point (8).

Similar increase of pressure in the plasma generator to a high pressure corresponding to the process condition while sustaining the plasma ignited under low pressure is not limited to the case of using the Ar/NF$_3$ gas but is also applicable to the case of using the Ar/F$_2$ gas.

In this case, too, the F$_2$ concentration in the Ar/F$_2$ mixed gas may be maintained constant or changed.

Further, the rare gas supplied to the plasma generator is not limited to the Ar gas but gas of any of He, Ne, Kr, Xe, or the like, may be used.

Figure 15:
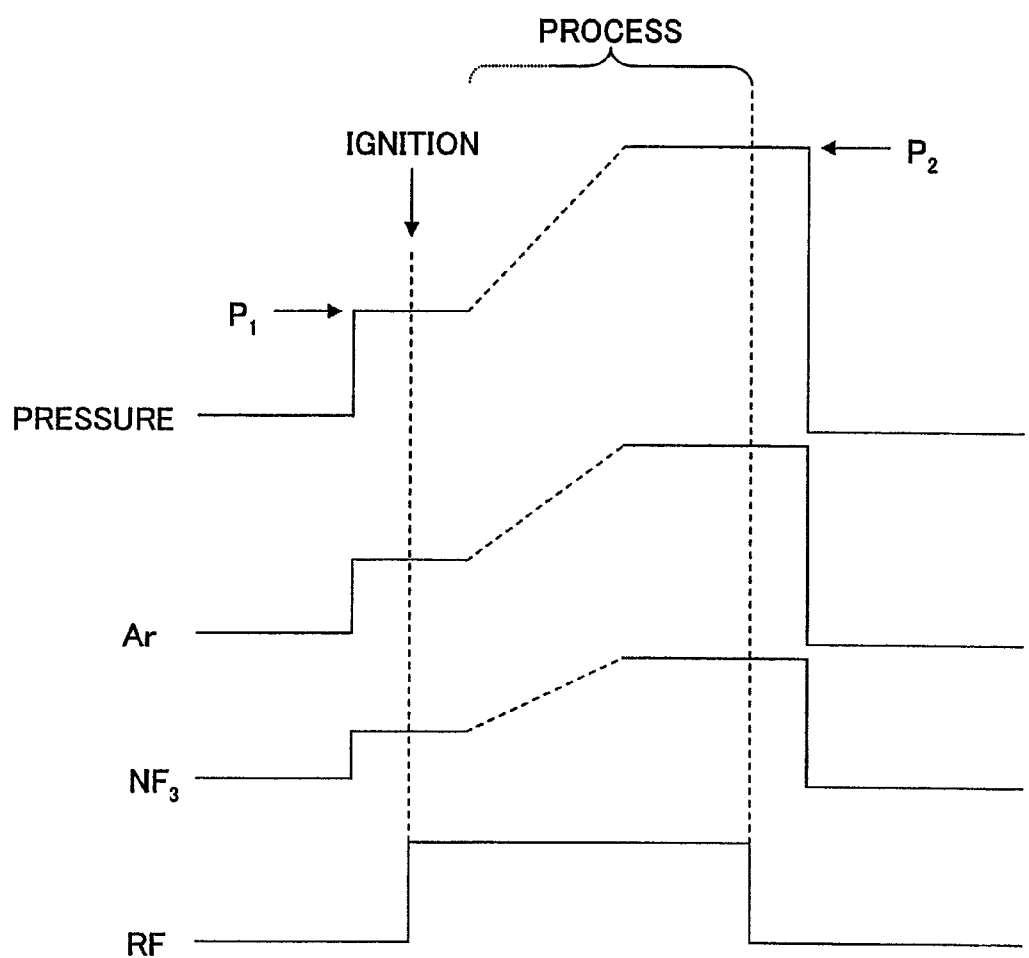
FIG. 15 is a diagram showing the gas and RF power supply sequence for the plasma cleaning/etching process according to the third embodiment of the present invention.

FIG. 15 shows the supply sequence of the gas used for cleaning or etching and the RF power based on the foregoing result, according to a third embodiment of the present invention.

Referring to FIG. 15, a small amount of Ar gas and NF$_3$ gas are supplied at first to the toroidal plasma generator 60 of FIG. 4 and ignition of plasma is achieved under the total pressure (P1) of 6.65-66.5 Pa by supplying the RF power.

After ignition of plasma, the flow rate of the Ar gas and the NF$_3$ gas is increased along an arbitrary path inside the region surrounded by the points (1)-(7) of FIG. 13, and the desired cleaning or etching process is conducted when the desired process pressure P2 has been reached. Thereafter, the RF power is shut down.

As explained previously, the cleaning process or etching process using NF$_3$ is already started immediately after the plasma ignition.

In the present embodiment, too, it is possible to use a F$_2$ gas in place of the NF$_3$ gas. In this case, the pressure P1 for the ignition process and the flow rates of the Ar gas and the F$_2$ gas have to be set so as to fall in the ignition range explained with reference to FIG. 12.

Fourth Embodiment

It should be noted that the foregoing relationship of FIG. 11, more specifically the tendency that the plasma ignition voltage decreases at low pressure but increases sharply when a pressure corresponding to a minimum has been passed, is thought as holding generally in the plasma generators 20-70 shown in FIG. 2A-2E or 3 in addition to the toroidal plasma generator, irrespective of the species of the rare gas and irrespective of the species of the halogen-containing etching gas or cleaning gas.

Thus, with the present embodiment, plasma ignition is made in a mixed gas of a rare gas and a gas containing the halogen compound, when using any of the plasma generators 20-70 shown in FIG. 2A-2E or 3 and applying plasma cleaning process to the interior of the processing vessel by using a gas containing a halogen compound or plasma etching process to the surface of a substrate to be processed by using a gas containing a halogen compound, by using the condition shown in FIG. 11 where the ignition voltage becomes minimum or the condition near the foregoing condition in which the ignition voltage becomes minimum.

With the present embodiment, ignition of the plasma occurs at low voltage, and there arises no problem that a high voltage is applied to the electrodes or coils of the plasma generator. Thus, damaging of the high-frequency power source, electrodes or coils does not occur even when there is caused a large impedance change with the plasma ignition.

As explained before, with the plasma cleaning process or plasma etching process, the efficiency of the process is improved when the concentration or partial pressure of the cleaning gas or etching gas such as NF$_3$ or F$_2$ is large. While it is true that cleaning process or etching process is started with ignition of the plasma also in the ignition region of FIG. 10 or 12 in view of the fact that the plasma contains the cleaning gas or etching gas, there may be cases in some apparatuses in which sufficient processing is not attained because of insufficient concentration of the cleaning or etching gas.

Thus, with the present embodiment, the total pressure of the mixed gas of the rare gas and the cleaning or etching gas is gradually increased to a desired processing pressure after ignition of the plasma according to a sequence similar to the one shown in FIG. 15.

In the sequence of FIG. 15, for example, it is possible to realize a desired total pressure and a gas concentration without extinguishing ignited plasma, by changing the total pressure and the gas flow rate from the ignition point (1) corresponding to the pressure P1 of FIG. 15 to the process point (2) corresponding to the pressure P2 of FIG. 15 where the actual cleaning processing is conducted, through the region surrounded in FIG. 13 by the points (1)-(7).

As explained, the points (4) and (6), and thus the path from the point (4) to the point (5), and the path from the point (6) to the point (7), are determined by the designing of the conductance valve 13B of the CVD apparatus used and the capacity of the vacuum pump 13, and thus, the path from the point (4) to the point (5) is shifted to the side of large flow rate when the maximum conductance of the conductance valve 13B is increased or the capacity of the vacuum pump 13 is increased. Further, the path from the point (6) to the point (7) is shifted to the high pressure side when the minimum conductance of the conductance valve 13B is decreased or the capacity of the vacuum pump 13 is decreased.

Further, the process point (2) can be set to any of the known conditions that provide efficient plasma cleaning.

Thus, it is possible to achieve a cleaning rate of about 2000 nm per minute for the thermal oxide film by increasing the NF$_3$ concentration in the Ar/NF$_3$ mixed gas to 80% in the process point (2). In this case, it is necessary to change the NF$_3$ concentration in the Ar/FN$_3$ mixed gas from the ignition point (1) to the process point (2), wherein it is confirmed that the plasma is sustained once it is ignited.

After the processing point (2) has been reached, it is possible to conduct ordinary cleaning process. In the CVD apparatus 10 of FIG. 1, it should be noted that the cleaning process is started in the toroidal plasma generator 20 used for the remote plasma source 16C, already at the moment there occurred plasma ignition.

In FIG. 13, it is possible to fix or change the mixed ratio of the Ar gas and the $NF_3$ gas in the Ar/$NF_3$ mixed gas in the case of moving from the ignition point (1) to the process point (2). Thereby, because the cleaning has been started immediately after ignition of the plasma, it is also possible to decrease the $NF_3$ concentration in the Ar/$NF_3$ mixed gas when moving from the ignition point (1) to the process point (2) according to the needs, in place of increasing the $NF_3$ concentration.

Further, with the CVD apparatus 10 of FIG. 1, it is also possible to conduct plasma etching of an insulation film such as a thermal oxide film or a CVD oxide film, plasma etching of a metal film such as a W film or a Ti film, or plasma etching of a conductive nitride film such as a TiN film or plasma etching of a polysilicon film, in the processing vessel 11 while using the plasma generator of any of FIGS. 2A-2E as the remote plasma source 16C.

Further, similarly to the previous embodiment, it is possible with the present embodiment to provide plural mass flow controllers 16a and 16b of different capacities to the $NF_3$ gas source 16A as shown in FIG. 14 and use these by switching by a valve. In FIG. 10, it can be seen that there are provided similar plural mass flow controllers 16c and 16d of different capacities to the Ar gas source 16B and they are switched by a valve when in use.

Thus, consider the case of increasing the flow rate of the Ar/$NF_3$ mixed gas starting from the ignition point (1) of FIG. 13 by the mass flow controller 16a along the path C and switch from the mass flow controller 16a to the mass flow controller 16b of larger capacity at the point (8) on the path C. In such a case there may be temporary drop of the flow rate and the total pressure to a point (9) with such switching of the mass flow controller, while it is possible to return to the point (10) on the path C by driving the mass flow controller of larger capacity. Thereby, according to the present embodiment, the plasma ignited at the point (1) is not extinguished as long as the point (9) is located inside the plasma sustained region indicated in FIG. 9.

Further, the recovered point (10) is not limited to be located on the path C but can be located at any point in the foregoing plasma sustaining region as long as the flow rate is larger than the point (8).

Further, while the present invention has been explained for the case of forming plasma by supplying an Ar/$NF_3$ mixed gas or an Ar/$F_2$ mixed gas to the toroidal plasma generator, the plasma generator of the present invention is not limited to a toroidal plasma generator but it applicable to any other plasma generators shown in FIGS. 2A-2E or FIG. 3 as explained with reference to the fourth embodiment.

Further, the diluting gas supplied for plasma formation is not limited to Ar, and the present invention holds even in the case a rare gas such as He, Ne, Kr, Xe, and the like is used, or in the case $H_2O$, $O_2$, $H_2$, $N_2$, $C_2F_6$, and the like, is used. Further, the cleaning/etching gas used with the present invention is not limited to $NF_3$ or $F_2$, but it is possible to use other halogen compound gas or a compound containing the $CH_3COO$ group such as $CH_3COOH$.

While the present invention has been explained for preferred embodiments, the present invention is not limited to such specific embodiments and various variations and modifications may be made within the scope as set forth in the claims.

The invention claimed is:

1. A cleaning method for cleaning an interior of a processing vessel by plasma-excited radicals of a cleaning gas under a first pressure, said method comprising the steps of:
    introducing a mixed gas of a diluting gas and said cleaning gas to a plasma generator under a second pressure lower than said first pressure;
    igniting plasma directly in said mixed gas at said second pressure by energizing said plasma generator; and
    increasing, after ignition of said plasma, a pressure inside said processing vessel to said first pressure from said second pressure while maintaining said plasma,
    wherein said step of increasing said pressure includes a phase in which a flow rate of said mixed gas is increased together with said pressure,
    wherein said plasma generator is a toroidal plasma generator, said toroidal plasma generator comprising a gas passage, said gas passage having a gas entrance and a gas outlet, forming a circuitous path, and having a coil wound around a part of said gas passage such that said coil winds around said gas passage at least twice, and
    wherein said energizing is conducted by feeding a current to said coil.

2. The cleaning method as claimed in claim 1, wherein said cleaning gas contains a halogen compound.

3. The cleaning method as claimed in claim 1, wherein said cleaning gas contains $NF_3$.

4. The cleaning method as claimed in claim 1, wherein said cleaning gas contains $F_2$.

5. The cleaning method as claimed in claim 1, wherein said diluting gas is selected from the group consisting of Ar, Kr and Xe.

6. The cleaning method as claimed in claim 1, wherein
    said step of increasing said pressure includes, after said step of igniting at said second pressure but before said phase in which said flow rate of said mixed gas is increased together with said pressure, another phase in which said flow rate of said mixed gas is increased while maintaining said second pressure;
    said phase in which said flow rate of said mixed gas is increased together with said pressure being conducted until said pressure reaches said first pressure; and
    said step of increasing said pressure further includes, after said phase in which said flow rate of said mixed gas is increased together with said pressure and said pressure has reached said first pressure, a further phase of increasing said flow rate of said mixed gas while maintaining said first pressure.

7. The cleaning method as claimed in claim 1, wherein
    cleaning said interior of said processing vessel is conducted at a first flow rate of said mixed gas;
    said step of igniting plasma at said second pressure is conducted at a second flow rate of said mixed gas smaller than said first flow rate;
    said step of increasing said pressure includes, after said step of igniting at said second pressure and said second flow rate but before said phase in which said flow rate of said mixed gas is increased together with said pressure, another phase in which said pressure of said mixed gas is increased while maintaining said second flow rate for said mixed gas;
    said phase in which said flow rate of said mixed gas is increased together with said pressure being conducted until said pressure reaches said first pressure; and
    said cleaning method further comprises, after said phase in which said pressure has reached said first pressure, a further phase of increasing said flow rate of said mixed gas to said first flow rate while maintaining said first pressure.

8. The cleaning method as claimed in claim 1, wherein
said phase in which said flow rate of said mixed gas is increased together with said pressure includes a step of switching from a first mass flow controller to a second mass flow controller; and
said pressure is maintained above said second pressure when a pressure drop is caused with said switching.

9. The cleaning method as claimed in claim 1, wherein a mixing ratio of said cleaning gas and said diluting gas is maintained constant from said igniting until said cleaning at said first pressure.

10. The cleaning method as claimed in claim 1, wherein a mixing ratio of said cleaning gas and said diluting gas is changed from said igniting until said cleaning at said first pressure.

11. A substrate processing method for etching a surface of a substrate to be processed by plasma-excited radicals under a first pressure, comprising the steps of:
 introducing a mixed gas of a diluting gas and an etching gas into a plasma generator under a second pressure lower than said first pressure;
 igniting plasma directly in said mixed gas at said second pressure by energizing said plasma generator; and
 increasing, after ignition of said plasma, said pressure inside said processing vessel to said first pressure from said second pressure while maintaining said plasma,
 wherein said step of increasing said pressure includes a phase in which a flow rate of said mixed gas is increased together with said pressure,
 wherein said plasma generator is a toroidal plasma generator, said toroidal plasma generator comprising a gas passage, said gas passage having a gas entrance and a gas outlet, forming a circuitous path, and having a coil wound around a part of said gas passage such that said coil winds around said gas passage at least twice, and
 wherein said energizing is conducted by feeding a current to said coil.

12. The substrate processing method as claimed in claim 11, wherein said etching gas contains a halogen compound.

13. The substrate processing method as claimed in claim 11, wherein said etching gas contains $NF_3$.

14. The substrate processing method as claimed in claim 11, wherein said etching gas contains $F_2$.

15. The substrate processing method as claimed in claim 11, wherein said diluting gas is selected from the group consisting of Ar, Kr and Xe.

16. The substrate processing method as claimed in claim 11, wherein
said step of increasing said pressure includes, after said step of igniting at said second pressure but before said phase in which said flow rate of said mixed gas is increased together with said pressure, another phase in which said flow rate of said mixed gas is increased while maintaining said second pressure;
said phase in which said flow rate of said mixed gas is increased together with said pressure being conducted until said pressure reaches said first pressure; and
said step of increasing said pressure further includes, after said phase in which said flow rate of said mixed gas is increased together with said pressure and said pressure has reached said first pressure, a further phase of increasing said flow rate of said mixed gas while maintaining said first pressure.

17. The substrate processing method as claimed in claim 11, wherein
said etching of said surface of said substrate is conducted at a first flow rate of said mixed gas;
said step of igniting plasma at said second pressure is conducted at a second flow rate of said mixed gas smaller than said first flow rate;
said step of increasing said pressure includes, after said step of igniting at said second pressure and said second flow rate but before said phase in which said flow rate of said mixed gas is increased together with said pressure, another phase in which said pressure of said mixed gas is increased while maintaining said second flow rate for said mixed gas;
said phase in which said flow rate of said mixed gas is increased together with said pressure being conducted until said pressure reaches said first pressure; and
said substrate processing method further includes, after said phase in which said pressure has reached said first pressure, a further phase of increasing said flow rate of said mixed gas to said first flow rate while maintaining said first pressure.

18. The substrate processing method as claimed in claim 11, wherein
said phase in which said flow rate of said mixed gas is increased together with said pressure includes a step of switching from a first mass flow controller to a second mass flow controller; and
said pressure is maintained above said second pressure when a pressure drop is caused with said switching.

19. The substrate processing method as claimed in claim 11, wherein a mixing ratio of said etching gas and said diluting gas is maintained constant from said igniting until said etching at said first pressure.

20. The substrate processing method as claimed in claim 11, wherein a mixing ratio of said etching gas and said diluting gas is changed from said igniting until said etching at said first pressure.

* * * * *